(12) United States Patent
Choi et al.

(10) Patent No.: US 9,905,802 B2
(45) Date of Patent: *Feb. 27, 2018

(54) ORGANIC LIGHT EMITTING DISPLAY APPARATUS AND METHOD OF MANUFACTURING THE SAME

(71) Applicant: Samsung Display Co., Ltd, Yongin-si, Gyeonggi-do (KR)

(72) Inventors: Jun-Ho Choi, Yongin-si (KR); Kwan-Hyun Cho, Yongin-si (KR); Jin-Koo Chung, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/089,920

(22) Filed: Apr. 4, 2016

(65) Prior Publication Data

US 2016/0218321 A1 Jul. 28, 2016

Related U.S. Application Data

(62) Division of application No. 14/066,519, filed on Oct. 29, 2013, now Pat. No. 9,331,308.

(30) Foreign Application Priority Data

May 29, 2013 (KR) .......................... 10-2013-0061251

(51) Int. Cl.
*H01L 51/56* (2006.01)
*H01L 51/52* (2006.01)
(Continued)

(52) U.S. Cl.
CPC ...... *H01L 51/5256* (2013.01); *H01L 27/3272* (2013.01); *H01L 51/0052* (2013.01);
(Continued)

(58) Field of Classification Search
CPC ............. H01L 51/5256; H01L 51/0052; H01L 51/0061; H01L 51/0072; H01L 51/0077;
(Continued)

(56) References Cited

U.S. PATENT DOCUMENTS 7,026,658 B2 4/2006 Park et al.
7,173,373 B2 2/2007 Yamada et al.
(Continued)

FOREIGN PATENT DOCUMENTS

EP 2530717 A3 12/2012
JP 2012-253015 12/2012
(Continued)

*Primary Examiner* — Mary Wilczewski
(74) *Attorney, Agent, or Firm* — Innovation Counsel LLP

(57) ABSTRACT

An organic light emitting display apparatus and a method of manufacturing the same are provided. The apparatus includes a substrate, a first electrode formed on the substrate, an intermediate layer formed on the first electrode. The intermediate layer includes an organic emission layer. A second electrode is formed on the intermediate layer, and a capping layer is formed on the second electrode in a first region. The capping layer includes a first edge portion and at least two layers. A third electrode is formed on the second electrode in a second region. The second region is not overlapped with the first region, and the third electrode includes a second edge portion having a side portion facing a side portion of the first edge portion of the capping layer. Electric properties and image quality may be improved.

13 Claims, 21 Drawing Sheets

(51) Int. Cl.
*H01L 51/00* (2006.01)
*H01L 27/32* (2006.01)

(52) U.S. Cl.
CPC ...... *H01L 51/0061* (2013.01); *H01L 51/0072* (2013.01); *H01L 51/0077* (2013.01); *H01L 51/5228* (2013.01); *H01L 51/5234* (2013.01); *H01L 51/5262* (2013.01); *H01L 27/326* (2013.01); *H01L 51/5203* (2013.01); *H01L 2251/5315* (2013.01)

(58) Field of Classification Search
CPC ............. H01L 27/3272; H01L 51/5203; H01L 52/5228; H01L 51/5234; H01L 51/5212
See application file for complete search history.

(56) References Cited

U.S. PATENT DOCUMENTS

| | | | |
|---|---|---|---|
| 7,597,602 B2 | 10/2009 | Yamada et al. | |
| 7,772,760 B2 | 8/2010 | Yoo et al. | |
| 8,872,206 B2 | 10/2014 | Chung et al. | |
| 8,895,972 B2 | 11/2014 | Chung et al. | |
| 8,994,010 B2 | 3/2015 | Choi et al. | |
| 2005/0062408 A1 | 3/2005 | Yoo et al. | |
| 2010/0102713 A1 | 4/2010 | Seo et al. | |
| 2010/0140649 A1 | 6/2010 | Kim et al. | |
| 2010/0171106 A1 | 7/2010 | Jung et al. | |
| 2012/0104422 A1 | 5/2012 | Lee et al. | |
| 2012/0140442 A1 | 6/2012 | Woo et al. | |
| 2012/0313099 A1 | 12/2012 | Chung et al. | |
| 2013/0161656 A1 | 6/2013 | Choi et al. | |
| 2013/0328022 A1 | 12/2013 | Choi et al. | |
| 2014/0145152 A1 | 5/2014 | Chung et al. | |
| 2014/0145156 A1 | 5/2014 | Choi et al. | |
| 2014/0353611 A1 | 12/2014 | Choi et al. | |
| 2016/0218321 A1* | 7/2016 | Choi .................. | H01L 51/5256 |

FOREIGN PATENT DOCUMENTS

| | | |
|---|---|---|
| KR | 100528911 A | 11/2005 |
| KR | 1020100036008 | 4/2010 |
| KR | 1020100047457 | 5/2010 |
| KR | 1020100081773 A | 7/2010 |
| KR | 1020100128794 | 12/2010 |
| KR | 101086580 A | 11/2011 |
| KR | 1020120080536 A | 2/2012 |
| KR | 10-2012-0061657 A | 6/2012 |

* cited by examiner

ORGANIC LIGHT EMITTING DISPLAY APPARATUS AND METHOD OF MANUFACTURING THE SAME

CROSS-REFERENCE TO RELATED PATENT APPLICATION

This application is a divisional application of U.S. patent application Ser. No. 14/066,519 filed on Oct. 29, 2013, which claims priority to Korean Patent Application No. 10-2013-0061251, filed on May 29, 2013, in the Korean Intellectual Property Office (KIPO), and all the benefits accruing therefrom under 35 U.S.C. § 119, the contents of the prior applications being herein incorporated by reference.

BACKGROUND

1. Field of the Invention

The present invention relates to an organic light emitting display apparatus and a method of manufacturing the same, and more particularly, to an organic light emitting display apparatus having improved electric properties and image quality.

2. Description of the Related Art

Portable and thin film type flat panel apparatus are increasingly used as display apparatuses. Among flat panel display apparatuses, an organic light emitting display apparatus is a self-emitting display apparatus having a wide viewing angle, good contrast and rapid response time, and has been attracting attention as a next generation display apparatus.

The organic light emitting display apparatus includes an intermediate layer, a first electrode and a second electrode. The intermediate layer includes an organic light emitting layer. When a voltage is applied to the first electrode and the second electrode, visible lights may be generated from the organic light emitting layer.

In this case, contamination and damage may be generated due to a sealing part disposed on the second electrode or impurities.

Due to the above-described factors, the improvement of the image quality and electric properties of the organic light emitting display apparatus may be limited.

SUMMARY OF THE INVENTION

An organic light emitting display apparatus of which electric properties and image quality may be easily improved, and a method of manufacturing the organic light emitting display apparatus are provided.

According to an aspect, there is provided an organic light emitting display apparatus including a substrate, a first electrode formed on the substrate, an intermediate layer formed on the first electrode. The intermediate layer includes an organic emission layer. A second electrode is formed on the intermediate layer and a capping layer is formed on the second electrode in a first region. The capping layer includes a first edge portion and at least two layers. A third electrode is formed on the second electrode in a second region. The second region is not overlapped with the first region, and the third electrode includes a second edge portion having a side portion facing another side portion of the first edge portion of the capping layer.

The third electrode may include a plurality of layers stacked in sequence.

The third electrode may include a lower electrode layer and an upper electrode layer stacked in sequence, and the capping layer may include a first capping layer and a second capping layer stacked in sequence.

The third electrode may include a single layer, and the capping layer may include a first capping layer and a second capping layer stacked in sequence.

The third electrode may include a lower electrode layer and an upper electrode layer stacked in sequence, and the capping layer may include a first capping layer, a second capping layer, a third capping layer and a fourth capping layer stacked in sequence.

A thickness of the third electrode may be greater than the thickness of the second electrode.

The adhesiveness between the third electrode and the capping layer may be smaller than the adhesiveness between the third electrode and the second electrode.

The capping layer may include 8-quinolinolato lithium, N,N-diphenyl-N,N-bis(9-phenyl-9H-carbazol-3-yl)biphenyl-4,4'-diamine), N(diphenyl-4-yl)9,9-dimethyl-N-(4(9-phenyl-9H-carbazol-3-yl)phenyl)-9H-fluorene-2-amine), or 2-(4-(9,10-di(naphthalene-2-yl)anthracene-2-yl)phenyl)-1-phenyl-1H-benzo-[D]imidazole.

The third electrode may include Mg.

The apparatus may include a light-transmitting area for transmitting an external light and a pixel area adjacent to the light-transmitting area and emitting light. The light-transmitting area and the pixel area may be positioned in the first region, and the first electrode may be overlapped with the pixel area.

The apparatus may further include a thin film transistor including an active layer, a gate electrode, a source electrode and a drain electrode, the thin film transistor making an electric connection with the first electrode, and the first electrode may be disposed so as to shield the thin film transistor.

The capping layer may be light-transmitting. All of edge portions of the capping layer and an edge portion of the third electrode may make be in contact with one another.

An area of the capping layer may be greater than an area emitting light in one pixel.

According to another aspect, there is provided a method of manufacturing an organic light emitting display apparatus including forming a first electrode on a substrate, forming an intermediate layer including an organic emission layer on the first electrode, forming a second electrode on the intermediate layer, and forming a capping layer on the second electrode in a first region. The capping layer has a first edge portion and at least two layers. A third electrode is formed on the second electrode in a second region. The second region is not overlapped with the first region, and the third electrode includes a second edge portion having a side portion facing a side portion of the first edge portion of the capping layer.

The third electrode and the capping layer may be formed through conducting a deposition process.

The adhesiveness between a metal for forming the third electrode and the capping layer may be smaller than the adhesiveness between the metal for forming the third electrode and the second electrode.

The capping layer may be formed by using a mask including a slit part of corresponding pattern of the capping layer.

The third electrode may be formed by using an open mask including an opening over the capping layer.

The third electrode may be formed by performing a deposition process without using a mask.

The forming of the capping layer may include forming a first layer disposed on the second electrode among at least two layers of the capping layer by using a mask having a slit part of corresponding pattern of the capping layer, and forming a remaining layer of the capping layer by using an open mask including an opening over the capping layer.

The forming of the capping layer may include forming a first layer disposed on the second electrode among at least two layers of the capping layer by using a mask having a slit part of corresponding pattern of the capping layer, and forming a remaining layer of the capping layer without using a mask.

The forming of the third electrode may be conducted after forming at least one layer of the capping layer.

The forming of the third electrode and the capping layer may include forming a first layer disposed on the second electrode among at least two layers of the capping layer by using a mask having a slit part of corresponding pattern of the capping layer, and forming the third electrode and a remaining layer of the capping layer by using an open mask in a co-deposition process, the open mask including an opening over the first layer of the capping layer.

The third electrode may include a plurality of electrode layers stacked in sequence.

The forming of the third electrode and the capping layer may include forming a lowermost layer making a contact with the second electrode among the plurality of the layers of the capping layer by using a mask including a slit part of corresponding pattern of the capping layer, and forming a lowermost electrode layer making a contact with the second electrode among the plurality of the electrode layers of the third electrode by using an open mask including an opening over the lowermost layer of the capping layer.

The method may include forming a remaining layer excluding the lowermost layer among the plurality of the layers of the capping layer by using a mask having a slit part of corresponding pattern of the capping layer, and forming a remaining layer excluding the lowermost electrode layer among the plurality of the electrode layers of the third electrode by using an open mask.

The method may include forming the remaining layer excluding the lowermost layer among the plurality of the layers of the capping layer by using the open mask, and forming the remaining layer excluding the lowermost electrode layer among the plurality of the electrode layers of the third electrode by using the open mask.

The forming of the third electrode and the capping layer may include alternately disposing a plurality of first deposition sources including a material for forming the capping layer and a plurality of second deposition sources including a material for forming the third electrode, and moving the substrate including the second electrode so as to correspond the substrate to the plurality of the first deposition sources and the plurality of the second deposition sources one by one.

The forming of the third electrode and the capping layer may include forming a layer disposed on the second electrode among at least two layers of the capping layer by using a mask having a slit part of corresponding pattern of the capping layer, and forming at least one layer of the third electrode and at least one layer of the remaining layer of the capping layer at the same time by using an open mask by means of a co-deposition process, the open mask including a opening over the capping layer.

According to the organic light emitting display apparatus and the method of manufacturing the organic light emitting display apparatus according to the present disclosure, electric properties and image quality may be easily improved.

BRIEF DESCRIPTION OF THE DRAWINGS

The above and other features and advantages will become more apparent by describing example embodiments with reference to the attached drawings in which.

DETAILED DESCRIPTION OF THE INVENTION

Figure 1:
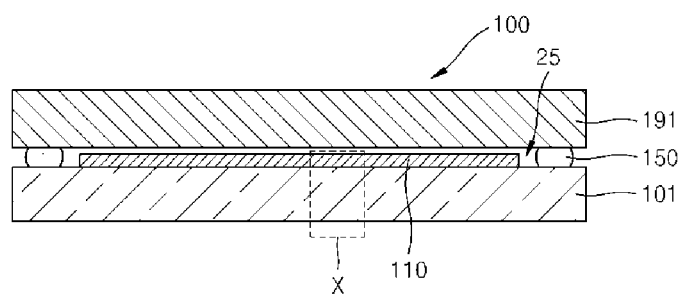
FIG. 1 is a schematic cross-sectional view of an organic light emitting display apparatus according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, example embodiments are merely described below, by referring to the figures, to explain aspects of the present description.

As used herein, the term "and/or" includes any and all combinations of one or more of the associated listed items.

Hereinafter, the constitution and operation will be explained in detail with reference to example embodiments illustrated in attached drawings.

FIG. 1 is a schematic cross-sectional view of an organic light emitting display apparatus according to an example embodiment.

Referring to FIG. 1, an organic light emitting display apparatus according to an embodiment includes an organic light emitting part 110 formed on a substrate 101 and a encapsulation substrate 191 for sealing the organic light emitting part 110.

The encapsulation substrate 191 may be formed to include a light-transmitting material, so that visible light generated at the organic light emitting part 110 may penetrate the encapsulation substrate 191, and the encapsulation substrate 191 may prevent the penetration of external gas and humidity into the organic light emitting part 110.

The substrate 101 and the encapsulation substrate 191 may be combined by a sealing material 150, and a space 25 between the substrate 101 and the encapsulation substrate 191 may be sealed. In the space 25, a moisture absorbent material or a filler may be disposed.

Figure 2:
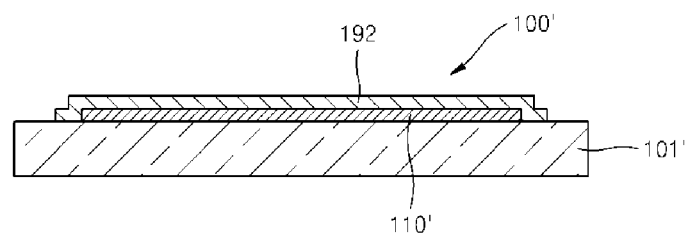
FIG. 2 is a schematic cross-sectional view of an organic light emitting display apparatus according to another example embodiment.

FIG. 2 is a schematic cross-sectional view of an organic light emitting display apparatus according to another example embodiment.

In the organic light emitting display apparatus 100' in FIG. 2, a encapsulation layer 192 of a thin film may be formed on an organic light emitting part 110' instead of forming the encapsulation substrate 191 in FIG. 1, so as to protect the organic light emitting part 110' from external air. The encapsulation layer 192 may be obtained by alternately forming a layer including an inorganic material, such as, for example, silicon oxide or silicon nitride, and a layer including an organic material, such as, for example, epoxy and polyimide, without limitation. Any sealing structure on a light-transmitting thin film may be applicable.

Figure 3:
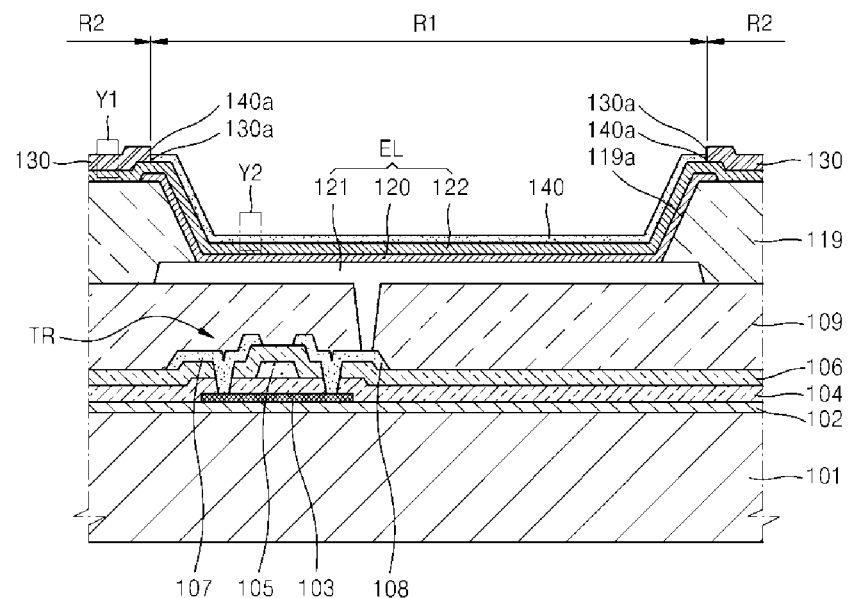
FIG. 3 is an enlarged view of X in FIG. 1.
Figure 4:
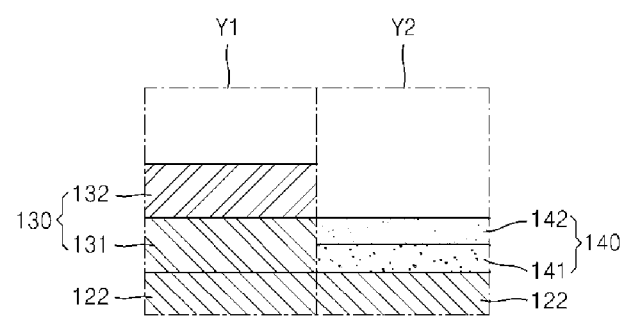
FIG. 4 is an enlarged view of Y1 and Y2 in FIG. 3.

FIG. 3 is an enlarged view of a region X outlined in FIG. 1, and FIG. 4 is an enlarged view of regions Y1 and Y2 outlined in FIG. 3. More particularly, FIG. 3 illustrates one pixel of the organic light emitting part 110 illustrated in FIG. 1. Alternatively, FIG. 3 may illustrate one pixel of the organic light emitting part 110' illustrated in FIG. 2.

Referring to FIG. 3, a buffer layer 102 is formed on a substrate 101, and a thin film transistor TR is formed on the buffer layer 102. The thin film transistor TR includes an active layer 103, a gate electrode 105, a source electrode 107 and a drain electrode 108.

Even though only one thin film transistor TR is illustrated in FIG. 3, the pixel may constitute a pixel circuit by further including at least one other thin film transistor and a capacitor.

The active layer 103 is formed on the buffer layer 102.

The buffer layer 102 may prevent the penetration of impurity elements and may function to planarize the surface thereof. The buffer layer 102 may be formed by using various materials that may perform the above-mentioned functions. For example, the buffer layer 102 may be formed by using an inorganic material such as silicon oxide, silicon nitride, silicon oxynitride, aluminum oxide, aluminum nitride, titanium oxide, titanium nitride, etc., or an organic material such as polyimide, polyester, acryl, etc., or may be formed as a stacked structure thereof. The buffer layer 102 may be omitted.

The active layer 103 may be formed of amorphous silicon, polycrystalline silicon or organic semiconductor material, but is not necessarily limited thereto. The active layer 103 may be formed by using an oxide semiconductor. For example, the active layer 103 may be a G-I—Z—O layer [$(In_2O_3)a(Ga_2O_3)b(ZnO)c$ layer] (in which a, b and c are real numbers satisfying a≥0, b≥0 and c≥0, respectively).

A gate insulating layer 104 covering the active layer 103 is formed on the buffer layer 102, and a gate electrode 105 is formed on the gate insulating layer 104.

An interlayer insulating layer 106 is formed on the gate insulating layer 104 to cover the gate electrode 105, and a source electrode 107 and a drain electrode 108 are formed on the interlayer insulating layer 106 and make respective contact with the active layer 103 through contact holes.

The structure of the above-described thin film transistor TR is not necessarily limited thereto, and various types of the structures of the thin film transistor may be applicable. For example, the thin film transistor TR illustrated in FIG. 3 may have a top gate structure. Alternatively, a thin film transistor TR of a gate bottom gate structure may be used. Alternatively, other applicable structures of all of the thin film transistors may be applied.

A pixel circuit (not illustrated) including a capacitor along with the thin film transistor TR may be formed.

A passivation layer 109 covering the pixel circuit including the thin film transistor TR is formed. The passivation layer 109 may be an insulating layer having a planarized upper surface of a single layer or a plurality of layers. The passivation layer 109 may be formed by using an inorganic material and/or an organic material.

On the passivation layer 109, an organic light emitting device EL is formed so as to make an electric connection with the thin film transistor TR. The organic light emitting device EL includes a first electrode 121, a second electrode 122 and an intermediate layer 120.

Particularly, the first electrode 121 is formed so as to make an electric connection with the drain electrode 108.

On the passivation layer 109, a pixel defining layer 119 covering the edge portion of the first electrode 121 is formed. The pixel defining layer 119 includes an opening portion 119a positioned to correspond to the center portion of the first electrode 121.

On the first electrode 121 exposed through the opening portion 119a, the intermediate layer 120 including an organic emission layer is formed and the second electrode 122 covering the intermediate layer 120 is formed.

The intermediate layer may include a low molecular weight organic layer or a high molecular weight organic layer. When the low molecular weight organic layer is used, a hole injection layer (HIL), a hole transport layer (HTL), an emission layer (EML), an electron transport layer (ETL), an electron injection layer (EIL), etc. may be used as a single layer structure or as a stacked complex structure. The low molecular weight organic layer may be formed by means of a vacuum deposition method.

The HIL may be formed by using, for example, a phthalocyanine compound such as copper phthalocyanine, etc. or a starburst type amine such as tris(4-carbazoyl-9-ylphenyl)amine (TCTA), 4,4',4"-tris(N-3-methylphenyl-N-phenylamino)triphenylamine (m-MTDATA), 1,3,5-tris[4-(2-methylphenylphenylamino)phenyl]benzene (m-MTDAPB), etc.

The HTL may be formed by using, for example, N,N'-bis(3-methylphenyl)-N,N'-diphenyl-[1,1-biphenyl]-4,4'-diamine (TDP), N,N'-di(naphthalene-1-yl)-N,N'-diphenylbenzidine (α-NPD), etc.

The EIL may be formed by using, for example, a material such as LiF, NaCl, CsF, $Li_2O$, BaO, 8-hydroxy-quinolinato lithium (Liq), etc.

The ETL may be formed by using, for example, tris(8-hydroxy)aluminium (Alq3).

The EML may include a host material and a dopant material. The EML may include an emission layer emitting various colors of visible light. In addition, the disposition of the EML may be diversely defined and may be disposed so as to produce different colors according to the pixels. However, the present disclosure may not be limited to the above-described embodiments. Color filters of different colors may be disposed according to the desired colors of the pixels after stacking a plurality of emission layers so as to accomplish white light with respect to the whole pixels according to a white light emitting method.

The first electrode 121 may function as an anode electrode, and the second electrode 122 may function as a cathode electrode. Alternatively, the polarities of the first electrode 121 and the second electrode 122 may be interchanged.

When the first electrode 121 functions as the anode electrode, the first electrode 121 may include a material having a high work function such as, for example, ITO, IZO, ZnO, $In_2O_3$, etc. and may additionally include a reflection layer formed by using, for example, Ag, Mg, Al, Pt, Pd, Au, Ni, Nd, Ir, Cr, Li, Yb, Ca, etc.

When the second electrode 122 functions as a cathode electrode, the second electrode 122 may be formed by using a metal such as, for example, Ag, Mg, Al, Pt, Pd, Au, Ni, Nd, Ir, Cr, Li, Ca, etc. In addition, the second electrode 122 may include, for example, ITO, IZO, ZnO, $In_2O_3$, etc. for the light transmission. In addition, the second electrode 122 may be formed as a thin film by using, for example, Al, Ag and/or Mg. The second electrode 122 is formed so that a common voltage may be applied to all of the pixels, and is thus formed as a common electrode which is not patterned to correspond to the pattern of the pixels. Alternatively, the second electrode 122 as the common electrode may be patterned in a mesh shape obtained by removing portions of the common electrode except for those overlapping the light emitting regions.

When the second electrode 122 is formed as the common electrode, a voltage drop may be generated at the second electrode 122. Particularly, when the apparatus in FIG. 3 is a top emitting type apparatus in which a user may view an image from the upper portion in FIG. 3, the sheet resistance of the second electrode 122 may be increased because the second electrode 122 includes a light-transmitting metal oxide or a metal thin film. In this case, the generated voltage drop may be even larger.

In order to solve the above-described defects, a third electrode 130 making an electric connection with the second electrode 122 may be further formed in the present disclosure.

In addition, the upper surface of the second electrode 122 may be damaged due to the encapsulation substrate 191 illustrated in FIG. 1. The upper surface of the second electrode 122 may also be easily damaged during the formation of the encapsulation layer 192 in FIG. 2. In order to solve the above-described defects, a capping layer 140 is formed on the second electrode 122.

The capping layer 140 is formed on the second electrode 122 in a first region R1 and has a first edge portion 140a.

The third electrode 130 is formed on the second electrode 122 in a second region R2 and has a second edge portion 130a. The third electrode 130 is disposed adjacent to the capping layer 140 while maintaining a horizontal state.

The area of a first region R1 is larger than an area generating light emission in at least one pixel, and corresponds to a region covering the region generating the light emission in one pixel. The capping layer 140 is formed on the whole first region R1, and the edge portion of the first region R1 is the first edge portion 140a of the capping layer 140. The second region R2 corresponds to a region excluding the first region R1 from the second electrode 122. The third electrode 130 is formed on the whole second region R2, and the edge portion of the second region R2 is the second edge portion 130a of the third electrode 130. The second region R2 is a region excluding the area generating the light emission.

The side portion of the first edge portion 140a of the capping layer 140 and the side portion of the second edge portion 130a of the third electrode 130 are in contact with each other.

The third electrode may be formed to have a thickness greater than that of the second electrode 122 so as to decrease the sheet resistance of the second electrode 122.

Because the capping layer 140 may cover the region generating the light emission in the pixel, the capping layer 140 may be formed so as to transmit light. The capping layer 140 may be formed as a thin film layer having a thickness smaller than the third electrode 130, however, the thickness of the capping layer 140 is not limited thereto.

In an example embodiment, the material of the third electrode 130 and the capping layer 140 may be selected so that adhesiveness between the third electrode 130 and the capping layer 140 may be smaller than that between the third electrode 130 and the second electrode 122.

The capping layer may be formed by using, for example, a material including 8-quinolinolato lithium (Liq), N,N-diphenyl-N,N-bis(9-phenyl-9H-carbazol-3-yl)biphenyl-4, 4'-diamine, N(diphenyl-4-yl)9,9-dimethyl-N-(4(9-phenyl-9H-carbazol-3-yl)phenyl)-9H-fluorene-2-amine, or 2-(4-(9, 10-di(naphthalene-2-yl)anthracene-2-yl)phenyl)-1-phenyl-1H-benzo-[D]imidazole.

The third electrode 130 may be formed by using, for example, Mg.

Mg used for forming the third electrode 130 is similar to the material used for forming second electrode 122, that is, both are formed by using metals, and the adhesiveness between the third and second electrodes 130 and 120 is good. However, the adhesiveness between Mg and the material of the above-described capping layer 140 is not good. Thus, the third electrode 130 may be simply patterned by using the adhesiveness properties between the third electrode 130 and the capping layer 140.

As described above, the third electrode 130 is patterned so as to be formed only in the second region R2. However, after forming the intermediate layer 120 of the organic light emitting device EL, the third electrode 130 may be patterned without having to use a wet process such as a photolithography process, which is widely used as a patterning method of a common metal layer. When humidity and/or oxygen penetrate into the intermediate layer 120 while conducting the wet process, the lifetime of the organic light emitting device EL may be rapidly decreased.

Thus, the patterning of the third electrode 130 is very difficult in a practical process.

According to the present disclosure, the third electrode 130 may be patterned by using the adhesive properties between the third electrode 130 and the capping layer 140. Particular methods will be described below.

The third electrode 130 and the capping layer 140 may each include multiple layers, respectively.

Referring to FIG. 4, the third electrode 130 includes a lower electrode layer 131 and an upper electrode layer 132.

In addition, the capping layer 140 includes a first capping layer 141 and a second capping layer 142. The first capping layer 141 and the second capping layer 142 include the above-described materials of the capping layer 140 and may be formed by using the same material or different materials.

In order to secure the target thickness of the capping layer 140, the deposition process is conducted more than once; it is conducted as two separate deposition processes. First, the first capping layer 141 is formed and the lower electrode layer 131 is formed. Then, the second capping layer 142 is formed and the upper electrode layer 132 is formed. In this case, the patterning of the third electrode 130 and the capping layer 140 may be easily conducted, and control of each process to form the minute pattern of the third electrode 130 and the capping layer 140 may be possible. In addition, the third electrode 130 may be easily prevented from being formed in the first region R1, and thus the transmittance of the organic light emitting display apparatus 100 may be improved.

In this example embodiment, the capping layer 140 is formed by conducting the deposition process twice, and the third electrode 130 is formed by conducting the deposition process twice. However, the deposition process may not be limited thereto, and may be separately conducted three or more times.

FIGS. 5 to 10 illustrate a method of manufacturing the organic light emitting display apparatus illustrated in FIG. 1 in sequence.

Figure 5:
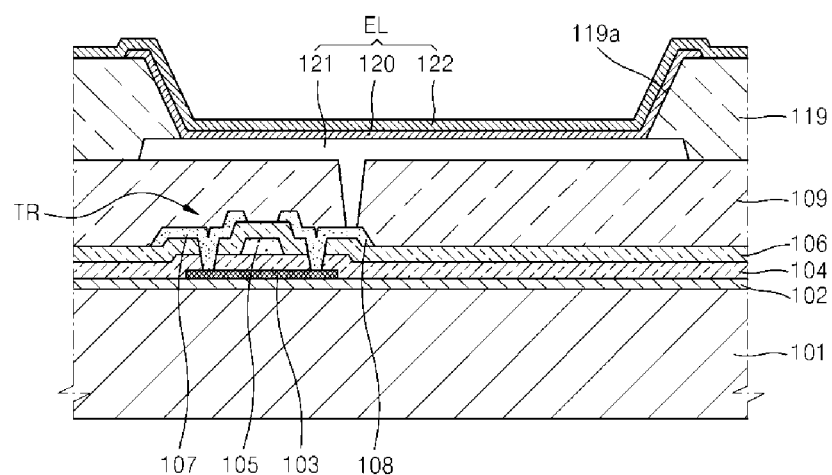
FIGS. 5, 6, 7, 8, 9, and 10 illustrate a method of manufacturing the organic light emitting display apparatus in FIG. 1 in sequence.

First, referring to FIG. 5, elements up to the second electrode 122 are formed on the substrate 101.

Figure 6:
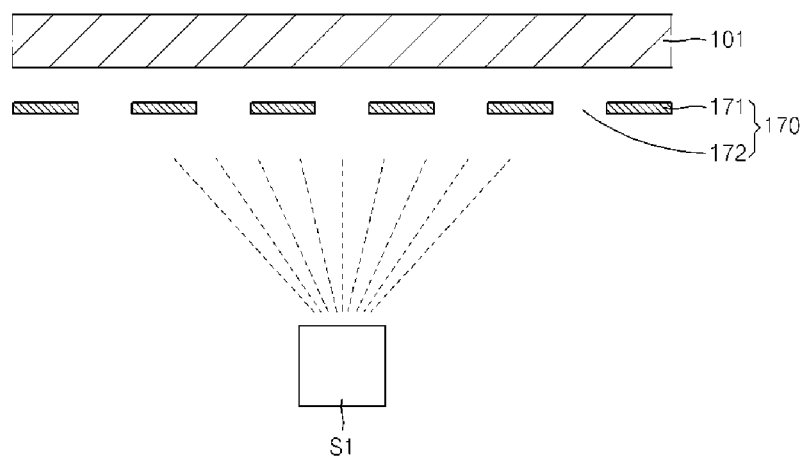

Then, referring to FIG. 6, a deposition process is conducted with respect to the substrate 101 on which the elements up to the second electrode 122 are formed. That is, a mask 170 is disposed so as to face the substrate 101, and the deposition process is conducted by using a first deposition source S1. The first deposition source S1 includes at least one material from among the above-described various materials for forming the capping layer 140.

The mask 170 includes a shielding part 171 and a slit part 172. The slit part 172 has a specific pattern corresponding to a region for forming the capping layer 140, that is, to the first region R1.

Figure 7:
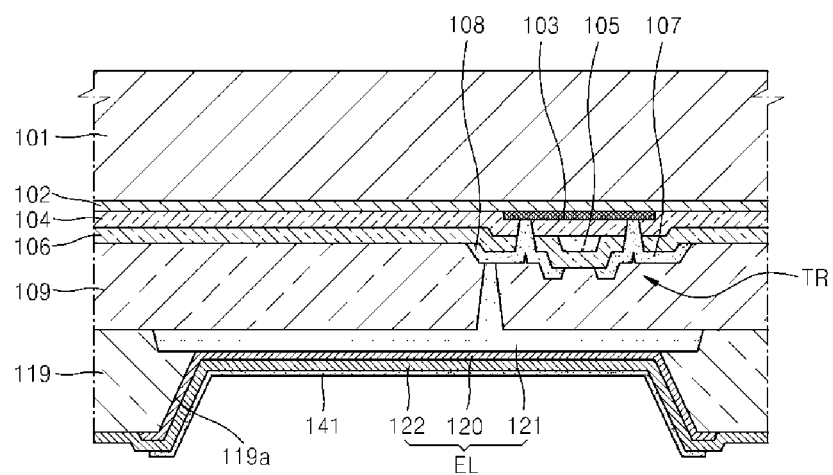

The deposition process by using the first deposition source S1 is conducted to form the first capping layer 141 of the capping layer 140 on the second electrode 122 in the first region R1, as illustrated in FIG. 7.

Figure 8:
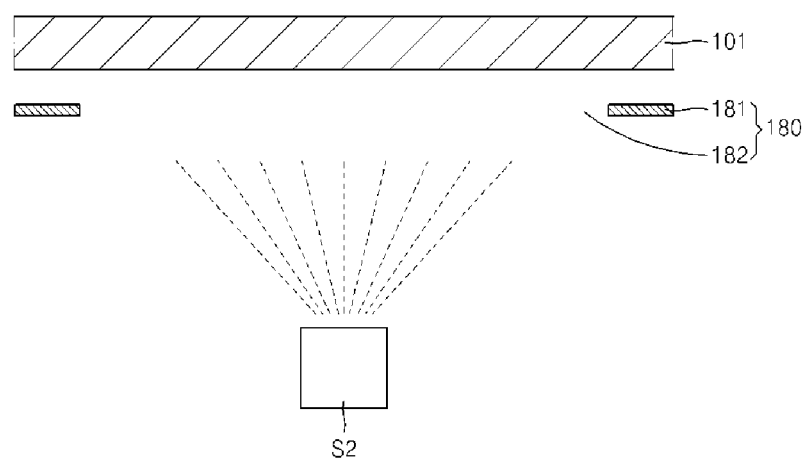

Then, referring to FIG. 8, the deposition process is conducted with respect to the substrate 101 including the elements formed up to the first capping layer 141. That is, an open mask 180 is disposed so as to face the substrate 101, and the deposition process is conducted using a second deposition source S2. The second deposition source S2 includes the above-described material for forming the third electrode 130, that is, Mg. The open mask 180 includes a shield part 181 and an opening part 182. The shield part 181 has a similar shape as a square window frame, and the opening part 182 forms the center of the shield part 181. The open mask 180 includes the opening part 182 having no specific pattern. That is, different from the above-described mask 170, the open mask 180 is formed to pass the deposition material onto the whole surface of the substrate 101, including over the capping layer deposited in the pattern, except for those portions of the surface of the substrate that are blocked by the borders of the shield part 181.

Meanwhile, even though the open mask 180 is provided in this example embodiment, the open mask 180 may be omitted when using the second deposition source S2 during the deposition process.

Through conducting the deposition process through the second deposition source S2, the lower electrode layer 131 of the third electrode 130 is formed on the second electrode 122 in the second region R2.

In this case, because the material for forming the third electrode 130 included in the second deposition source S2 has poor adhesiveness with the first capping layer 141, a layer of second deposition source S2 material may not be formed on the first capping layer 141, but a layer may be formed only on the exposed portions of second electrode 122, the second electrode 122 having relatively good adhesiveness with the second deposition source S2 material.

Thus, the lower electrode layer 131 may be naturally patterned without using a separate mask or without conducting a patterning process. Particularly, the whole of the third electrode 130 may be formed by conducting the deposition process more than once. That is, the whole of the third electrode 130 may be formed by first forming the lower electrode layer 131 to a specific thickness corresponding to half of the desired thickness of the third electrode 130. In this case, the minute patterning of the lower electrode layer 131 may be possible.

Figure 9:
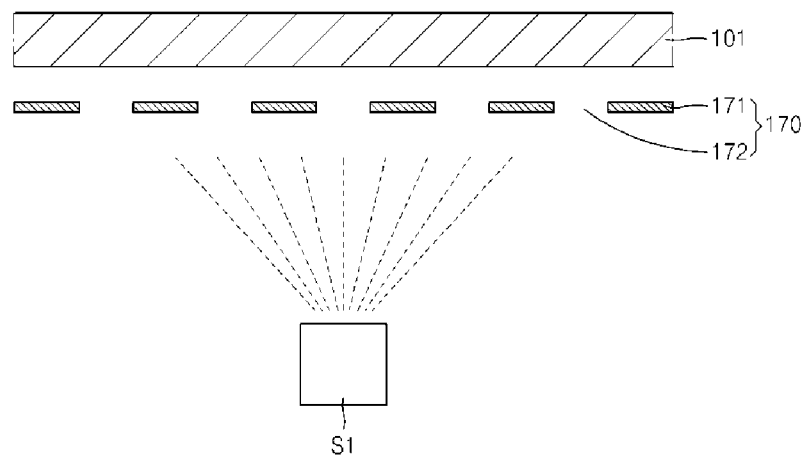

Then, referring to FIG. 9, the deposition process is conducted with respect to the substrate 101 including elements formed up to the lower electrode layer 131. That is, the mask 170 is disposed so as to face the substrate 101 as illustrated in FIG. 6, and the deposition process is conducted using the first deposition source S1 to form the second capping layer 142 on the first capping layer 141 in the first region R1, to complete the capping layer 140. Because the mask 170 is the same as that described above, detailed description thereof will be omitted. In addition, because the masks 270 and 370 in this example embodiment are the same as the mask 170, detailed description thereof will also be omitted.

Figure 10:
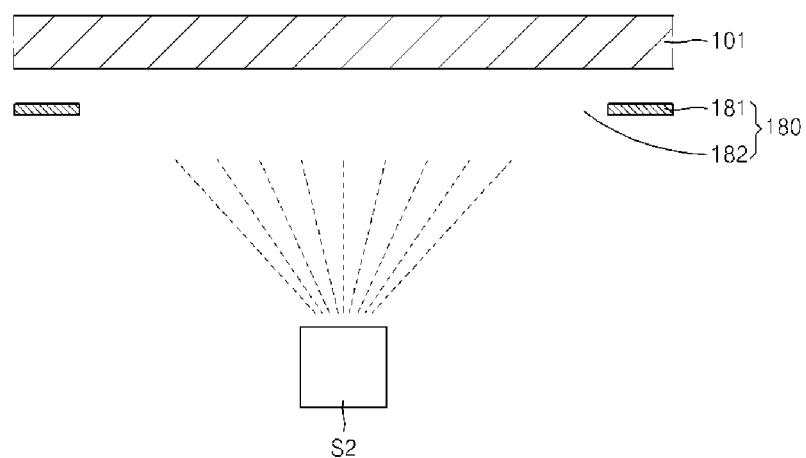

Referring to FIG. 10, the deposition process is conducted with respect to the substrate 101 including the elements formed up to the second capping layer 142. That is, as illustrated in FIG. 8, the open mask 180 is disposed so as to face the substrate 101, and the deposition process is conducted using the second deposition source S2 to form the upper electrode layer 132 on the lower electrode layer 131 in the second region R2 to complete the third electrode 130. As described above, the upper electrode layer 132 may be formed by conducting the deposition process using the second deposition source S2 without using the open mask 180.

Because the open mask 180 is the same as described above, detailed description thereof will be omitted. In addition, because the open masks 280 and 380 in a following example embodiment are the same as the open mask 180, detailed description thereof will also be omitted.

In this example embodiment, the first capping layer 141 and the second capping layer 142 are formed by using the mask 170 two separate times to complete the capping layer 140. Through the processes, the capping layer 140 may be easily formed into a target pattern having a target thickness. Particularly, the minute pattern of the capping layer 140 may be controlled so that it corresponds to only the first region R1 may be possible.

In addition, the lower electrode layer 131 and the upper electrode layer 132 are formed by using the open mask 180 two separate times to complete the third electrode 130.

Particularly, after forming the first capping layer 141, the lower electrode layer 131 is formed in the second region R2 to a desired shape by using the first capping layer 141. In addition, after forming the second capping layer 142, the upper electrode layer 132 is formed in the second region R2 to a desired shape by using the second capping layer 142. Through the method, the minute patterning of the third electrode 130 in the second region R2 without using a mask having a specific pattern may be easily accomplished.

Figure 11:
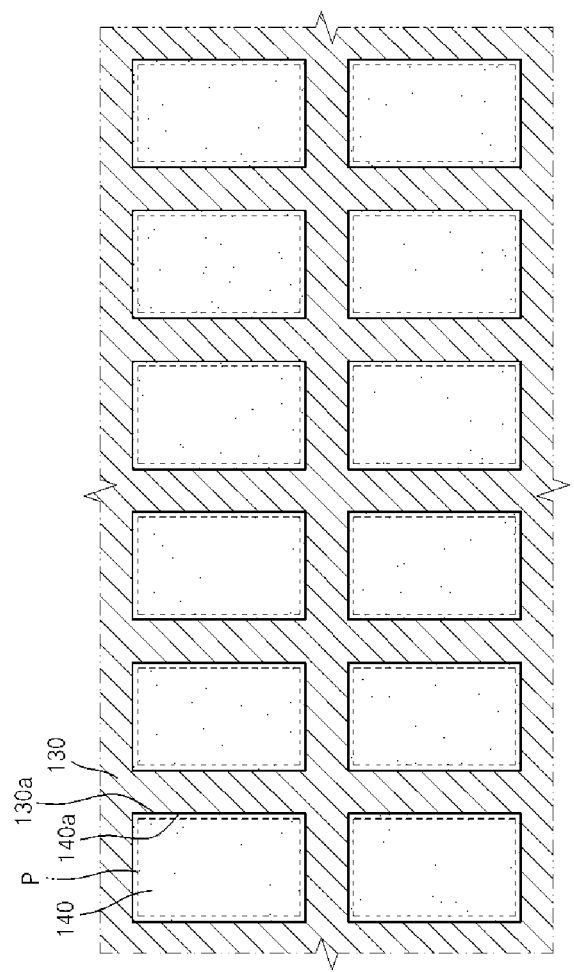
FIGS. 11, 12, and 13 illustrate various embodiments of the shapes of a capping layer of the organic light emitting display apparatus in FIG. 1.
Figure 12:
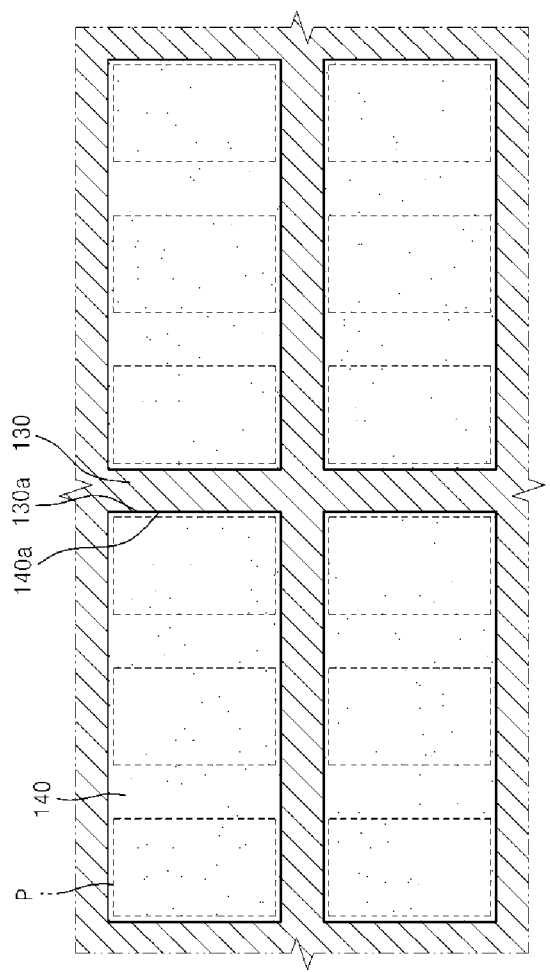
Figure 13:
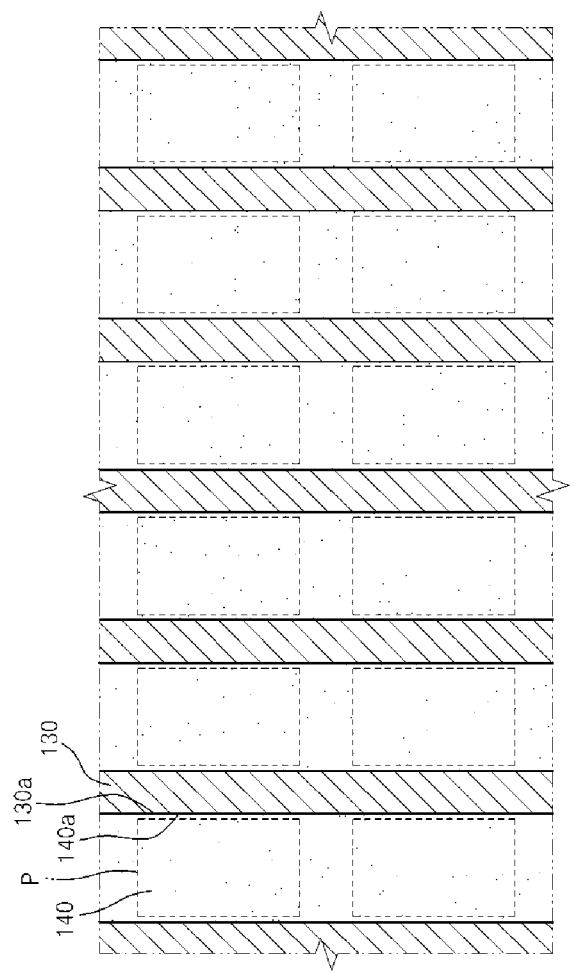

FIGS. 11 to 13 illustrate various example embodiments of the shapes of a capping layer of the organic light emitting display apparatus in FIG. 1.

As illustrated in FIG. 11, one capping layer 140 may be provided per one pixel P as an island shape. In FIG. 11, the capping layer 140 has an area covering the whole area of one pixel P. However, the capping layer 140 may have an area covering only the light emitting region of pixel P as described above, without limitation. In this case, the third electrode 130 may form a lattice pattern between each of the pixels P.

As illustrated in FIG. 12 as another example embodiment, one capping layer 140 may be provided for a plurality of the pixels P as an island shape. In this case, the third electrode 130 may form a lattice pattern between the pluralities of the pixels P.

As illustrated in FIG. 13 as another example embodiment, the capping layer 140 may be provided for a plurality of the pixels P arranged in a row in a stripe shape. In this case, the third electrode 130 may form a stripe pattern between each row of the pixels P.

FIGS. 14 to 17 illustrate another example embodiment of a method of manufacturing the organic light emitting display apparatus in FIG. 1.

Figure 14:
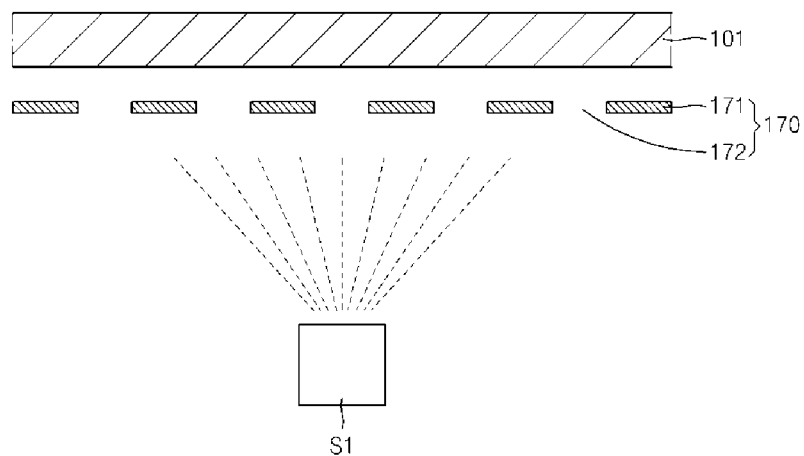
FIGS. 14, 15, 16, and 17 illustrate another example embodiment of a method of manufacturing the organic light emitting display apparatus in FIG. 1.

Referring to FIG. 14, a deposition process is conducted with respect to a substrate 101 including the elements formed up to a second electrode 122. A mask 170 includes a shield part 171 and a slit part 172. The slit part 172 has a specific pattern corresponding to a region for forming a capping layer 140, that is, a first region R1.

Through conducting the deposition process using a first deposition source S1, a first capping layer 141 of the capping layer 140 is formed on the second electrode 122 in the first region R1.

Figure 15:
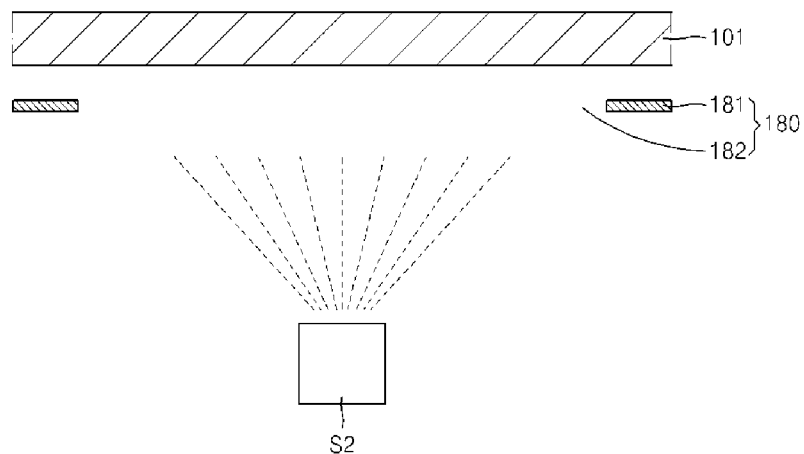

Then, referring to FIG. 15, the deposition process is conducted with respect to the substrate 101 including the elements formed up to the first capping layer 141. That is, an open mask 180 is disposed so as to face the substrate 101, and the deposition process is conducted using a second deposition source S2. Through conducting the deposition process using the second deposition source S2, a lower electrode layer 131 of the third electrode 130 is formed on the second electrode in a second region R2.

Figure 16:
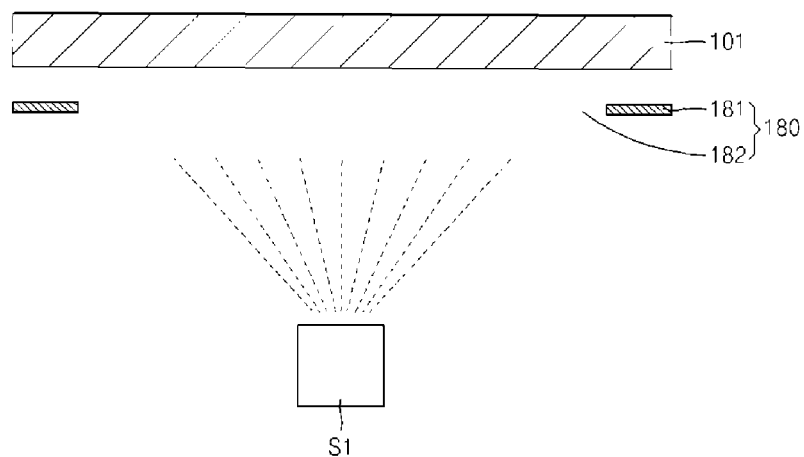

Then, referring to FIG. 16, the deposition process is conducted with respect to the substrate 101 including the elements formed up to the lower electrode layer 131. Particularly, the open mask 180 is disposed so as to face the substrate 101, and the deposition process is conducted by using the first deposition source S1 to form a second capping layer 142 on the first capping layer 141 in the first region R1 to complete the capping layer 140. In this case, the material for forming the second capping layer 142 included in the first deposition source S1 has good adhesive properties with respect to the first capping layer 141 and has poor adhesive properties with respect to the lower electrode layer 131. Thus, a layer of the first deposition source S1 material may not be formed on the lower electrode layer 131, but a layer of the first deposition source material S1 may be formed on the first capping layer 141 having relatively good adhesiveness.

Figure 17:
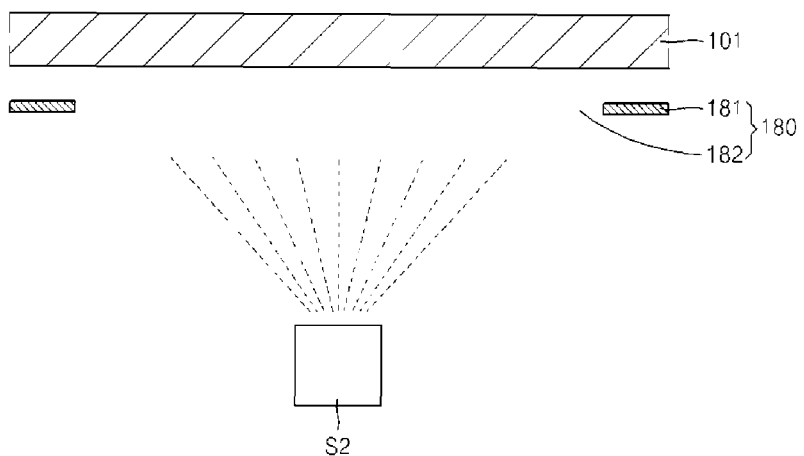

Then, referring to FIG. 17, the deposition process is conducted with respect to the substrate 101 including the elements formed up to the second capping layer 142. That is, the open mask 180 is disposed so as to face the substrate 101, and the deposition process using the second deposition source S2 is conducted to form an upper electrode layer 132 on the lower electrode layer 131 in the second region R2 to complete the third electrode 130.

Figure 18:
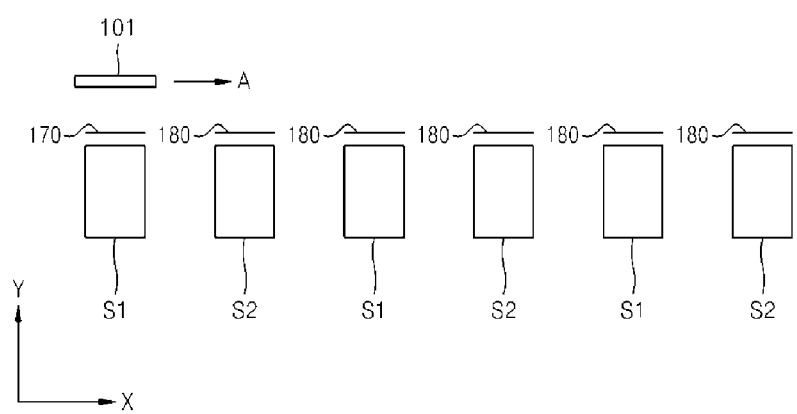
FIG. 18 illustrates another example embodiment of a method of manufacturing the organic light emitting display apparatus in FIG. 1.

FIG. 18 illustrates another example embodiment of a method of manufacturing the organic light emitting display apparatus illustrated in FIG. 1.

Referring to FIG. 18, the deposition process is continuously conducted while moving a substrate 101 that includes elements formed up to second electrode 122 along a direction indicated by the arrow A (x-axis direction). That is, a deposition process is conducted with respect to the substrate 101 using a first deposition source S1. A mask 170 is disposed over the substrate 101 to form a first capping layer in a first region R1.

Then, the deposition process is conducted using a second deposition source S2, the first deposition source S1, the second deposition source S2, the first deposition source S1 and the second deposition source S2 one by one. Particularly, an open mask 180 is disposed over the substrate 101 to conduct the deposition process. Alternatively, the deposition process may be conducted excluding the open mask 180.

Through conducting the above-described processes, a third electrode 130 obtained by stacking three layers and a capping layer 140 obtained by integrating three layers may be easily formed.

Figure 19:
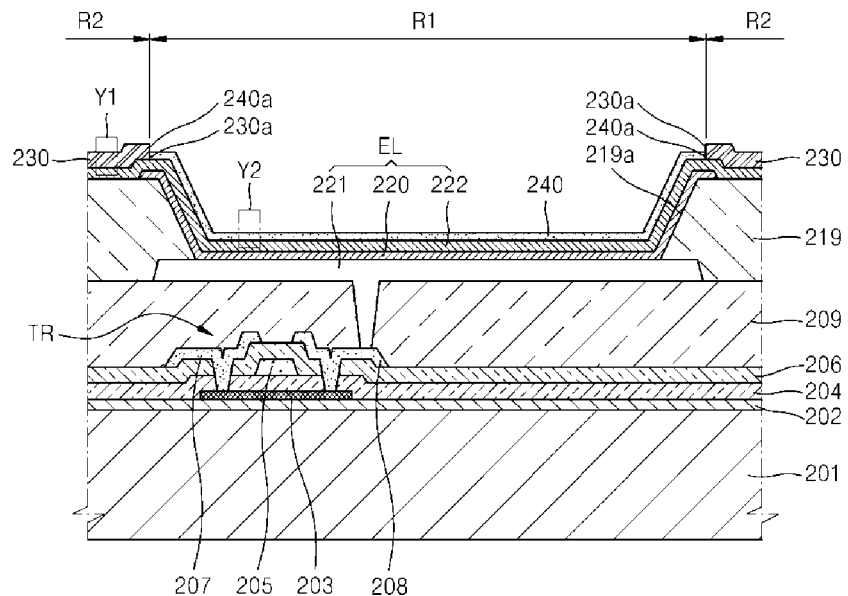
FIG. 19 is a cross-sectional view of an organic light emitting display apparatus according to another example embodiment.
Figure 20:
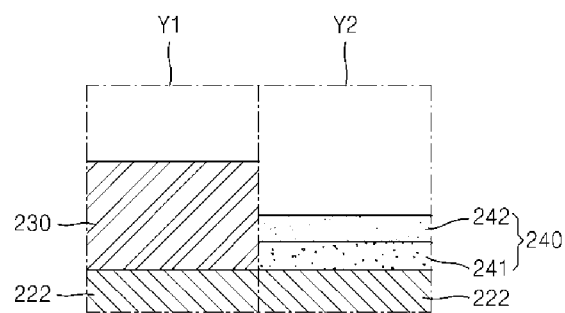
FIG. 20 is an enlarged view of Y1 and Y2 in FIG. 19.

FIG. 19 is a cross-sectional view of an organic light emitting display apparatus according to another example embodiment. FIG. 20 is an enlarged view of the regions Y1 and Y2 shown in FIG. 19. For the convenience of explanation, different portions from the above-described example embodiment will be explained in priority.

Referring to FIGS. 19 and 20, a buffer layer 202 is formed on a substrate 201, and a thin film transistor TR is formed on the buffer layer 202. The thin film transistor TR includes an active layer 203, a gate electrode 205, a source electrode 207 and a drain electrode 208.

The active layer 203 is formed on the buffer layer 202, a gate insulating layer 204 covering the active layer 203 is formed, and a gate electrode 205 is formed on the gate insulating layer 204. An interlayer insulating layer 206 covering the gate electrode 205 is formed on the gate insulating layer 204. On the interlayer insulating layer 206, a source electrode 207 and a drain electrode 208 are formed and respectively make contact with the active layer 203 through contact holes. A passivation layer 209 covering a pixel circuit including the thin film transistor TR is formed. On the passivation layer 209, an organic light emitting device EL making an electric connection with the thin film transistor TR is formed. The organic light emitting device EL includes a first electrode 221, a second electrode 222 and an intermediate layer 220. Particularly, the first electrode 221 is formed so as to make an electric connection with the drain electrode 208. On the passivation layer 209, a pixel defining layer 219 including an opening portion 219a is formed.

On the first electrode 221, an intermediate layer 220 including an organic light emission layer is formed, and the second electrode 222 covering the intermediate layer 220 is formed.

A third electrode 230 making an electric connection with the second electrode 222 is formed, and a capping layer 240 is formed on the second electrode 222.

The capping layer 240 is formed on the second electrode 222 in the first region R1, and has a first edge portion 240a.

The third electrode 230 is formed on the second electrode 222 in the second region R2, and has a second edge portion 230a. The third electrode 230 is disposed adjacent to the capping layer 240 while maintaining a horizontal state.

The side portion of the first edge portion 240a of the capping layer 240 and the side portion of the second edge portion 230a of the third electrode 230 may contact each other.

The third electrode 230 may be formed to have a thickness greater than the second electrode 222 so as to decrease the sheet resistance of the second electrode 222.

Because the capping layer 240 may cover the region of emitting light in the pixel, the capping layer 240 may be formed so as to transmit light. The capping layer 240 may be formed as a thin film layer having a thickness smaller than the third electrode 230, however, the thickness of the capping layer 240 is not limited thereto. As illustrated in an example embodiment, the materials of the third electrode 230 and the capping layer 240 may be selected so that the adhesiveness between the third electrode 230 and the capping layer 240 is smaller than the adhesiveness between the third electrode 230 and the second electrode 222.

The capping layer 240 includes multiple layers in this example embodiment.

Referring to FIG. 20, the capping layer 240 includes a first capping layer 241 and a second capping layer 242. The first capping layer 241 and the second capping layer 242 may include the above-described materials of the capping layer 240, and may be formed by using the same material or different materials.

In order to achieve the target thickness of the capping layer 240, the deposition process may be conducted more than one time. Particularly, the deposition process is conducted two separate times. That is, after forming the first capping layer 241, the third electrode 230 and the second capping layer 242 are formed at the same time, as described below. Through the above-described processes, the third electrode 230 and the capping layer 240 may be easily patterned and controlled, and the minute pattern of each layer may be possible. In addition, the formation of the third electrode 230 in the first region R1 may be easily prevented to improve the transmittance of the organic light emitting display apparatus 200.

Figure 21:
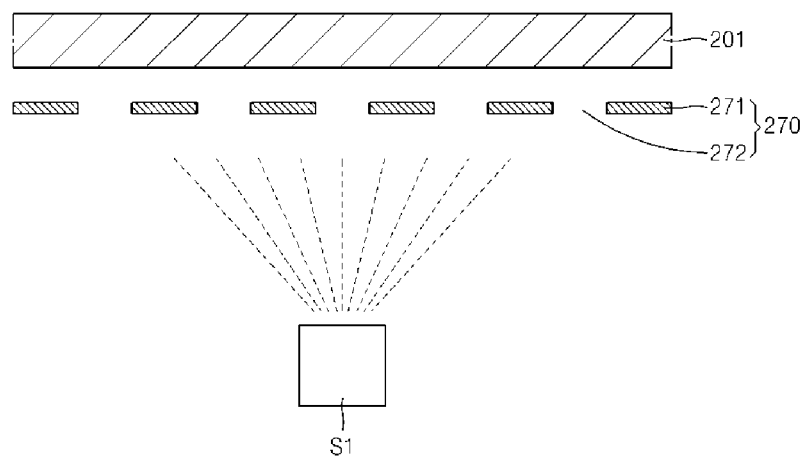
FIGS. 21 & 22 illustrate a method of manufacturing the organic light emitting display apparatus in FIG. 19.
Figure 22:
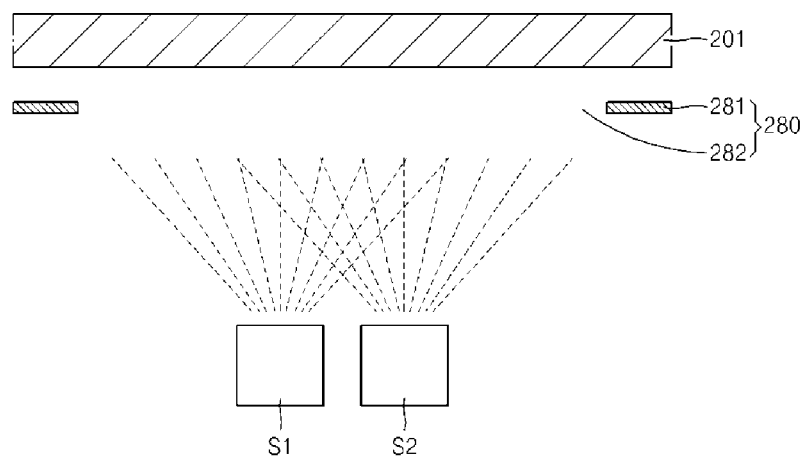

FIGS. 21 and 22 illustrate a method of manufacturing the organic light emitting display apparatus illustrated in FIG. 19.

First, referring to FIG. 21, a deposition process is conducted with respect to the substrate 201. Even though not illustrated, elements up to the second electrode 222 are formed on the substrate 201.

A mask 270 is disposed so as to face the substrate 201, and the deposition process is conducted using the first deposition source S1. The mask 270 includes a shielding part 271 and a slit part 272. The slit part 272 includes a specific pattern corresponding to a region for forming the capping layer 240, that is, the first region R1.

Through conducting the deposition process by using the first deposition source S1, the first capping layer 241 of the capping layer 240 is formed on the second electrode 222 in the first region R1.

Then, referring to FIG. 22, the deposition process is conducted with respect to the substrate 201 including the elements formed up to the first capping layer 241.

That is, an open mask 280 is disposed so as to face the substrate 201, and a co-deposition process using the first deposition source S1 and the second deposition source S2 is conducted. Alternatively, the use of the open mask 280 may be omitted.

Through conducting the co-deposition process by using the first deposition source S1 and the second deposition source S2, the third electrode 230 is formed on the second electrode 222 in the second region R2, and the second capping layer 242 is formed on the first capping layer 241 in the first region R1.

In this case, because the adhesiveness of the material for forming the third electrode 230 included in the second deposition source S2 with the first capping layer 241 is not good, a layer may not be formed on the first capping layer 241. However, a layer may be formed on the second electrode 222 having relatively good adhesiveness. Similarly, the material for forming the second capping layer 242 included in the first deposition source S1 may be formed on the first capping layer 241 having relatively good adhesiveness.

Thus, the third electrode 230 and the second capping layer 242 may be naturally patterned without using a separate mask or without conducting a separate patterning process.

In this example embodiment, after forming the first capping layer 241 using the mask 270, the second capping layer 242 is formed using the open mask 280 to complete the capping layer 240. Through conducting the above-described processes, the capping layer 240 may be easily formed as a pattern having a target thickness. Particularly, the minute pattern of the capping layer 240 corresponding to only the first region R1 may be possible.

In addition, the third electrode 230 is formed while depositing the second capping layer 242 using the open mask 280. Through conducting the processes, the minute patterning of the third electrode 230 in the second region R2 without using a mask having a specific pattern may be easily accomplished.

Figure 23:
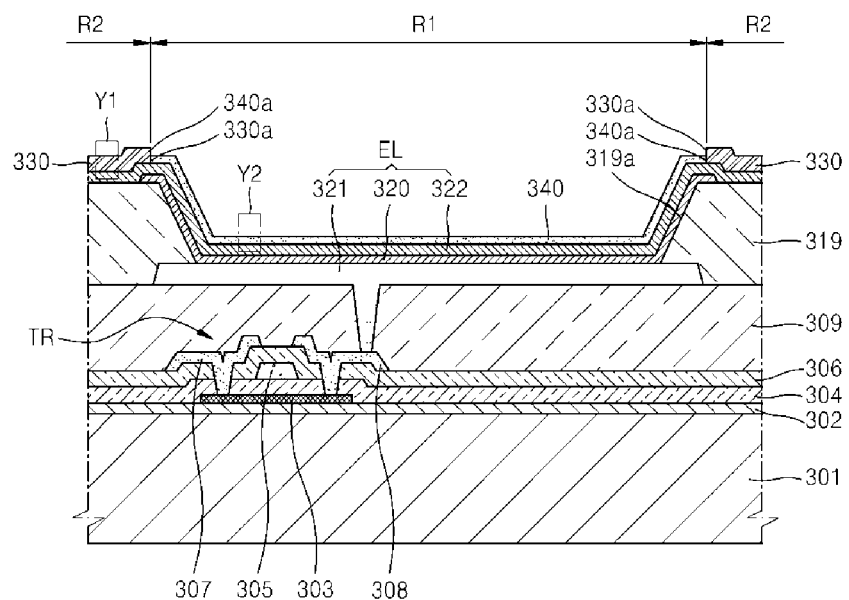
FIG. 23 is a cross-sectional view of an organic light emitting display apparatus according to another example embodiment.
Figure 24:
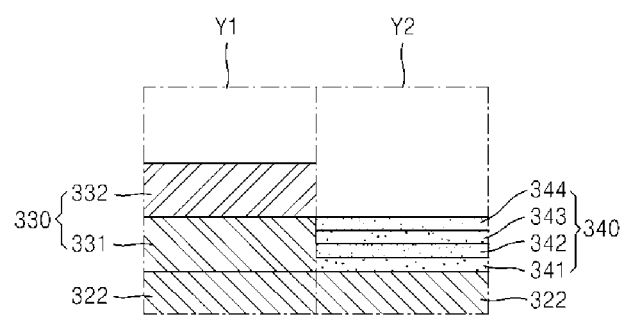
FIG. 24 is an enlarged view of Y1 and Y2 in FIG. 23.

FIG. 23 is a cross-sectional view of an organic light emitting display apparatus according to another example embodiment. FIG. 24 is an enlarged view of regions Y1 and Y2 shown in FIG. 23. For the convenience of the explanation, different portions from the above-described example embodiment will be explained in priority.

Referring to FIGS. 23 and 24, a buffer layer 302 is formed on a substrate 301, and a thin film transistor TR is formed on the buffer layer 302. The thin film transistor TR includes an active layer 303, a gate electrode 305, a source electrode 307 and a drain electrode 308.

On the buffer layer 302, the active layer 303 is formed, a gate insulating layer 304 covering the active layer 303 is formed, and the gate electrode 305 is formed on the gate insulating layer 304. An interlayer insulating layer 306 covering the gate electrode 305 is formed on the gate insulating layer 304, and the source electrode 307 and the drain electrode 308 are formed on the interlayer insulating layer 306 to respectively make contact with the active layer 303 through contact holes. A passivation layer 309 covering a pixel circuit including the thin film transistor TR is formed. On the passivation layer 309, an organic light emitting device EL making an electric connection with the thin film transistor TR is formed. The organic light emitting device EL includes a first electrode 321, a second electrode 322 and an intermediate layer 320. Particularly, the first electrode 321 is formed so as to make an electric connection with the drain electrode 308. On the passivation layer 309, a pixel defining layer 319 including an opening portion 319a is formed.

On the first electrode 321, the intermediate layer 320 including the organic light emission layer is formed, and the second electrode 322 covering the intermediate layer 320 is formed.

A third electrode 330 is formed so as to make an electric connection with the second electrode, and a capping layer 340 is formed on the second electrode 322.

The capping layer 340 is formed on the second electrode 322 in the first region R1 and has a first edge portion 340a.

The third electrode 330 is formed on the second electrode 322 in the second region R2 and has a second edge portion 330a. The third electrode 330 is disposed adjacent to the capping layer 340 while maintaining a horizontal state.

The side portion of the first edge portion 340a of the capping layer 340 and the side portion of the second edge portion 330a of the third electrode 330 contact each other.

The third electrode 330 may be formed to have a thickness greater than the second electrode 322 so as to decrease the sheet resistance of the second electrode 322.

Because the capping layer 340 may cover a region emitting light in the pixel, the capping layer may be formed so as to transmit the light. The capping layer 340 may be formed as a thin film layer having a thickness smaller than the third electrode 330, however, the thickness of the capping layer 340 is not limited thereto.

In an example embodiment, the materials for forming the third electrode 330 and the capping layer 340 may be selected so that the adhesiveness between the third electrode 330 and the capping layer 340 is smaller than the adhesiveness between the third electrode 330 and the second electrode 322.

The capping layer 340 and the third electrode 330 each include multiple layers.

Referring to FIG. 24, the third electrode 330 includes a lower electrode layer 331 and an upper electrode layer 332. In addition, the capping layer 340 includes a first capping layer 341, a second capping layer 342, a third capping layer 343 and a fourth capping layer 344. The first capping layer 341 to the fourth capping layer 344 may be formed by using the same material or different materials.

In order to achieve the target thickness of the capping layer 340, the deposition process may be conducted more than one time. The deposition process is conducted multiple times, particularly, four times. In addition, in order to achieve the target thickness of the third electrode 330, the deposition process may be conducted two times.

That is, after forming the first capping layer 341, the lower electrode layer 331 and the second capping layer 342 are formed at the same time. After forming the third capping layer 343, the upper electrode layer 332 and the fourth capping layer 344 are formed at the same time. Particular explanation will be described herein below.

Through conducting the above-described processes, the patterning of the third electrode 330 and the capping layer 340 may be easily conducted and controlled, and the minute pattern for each layer may be possible. In addition, the formation of the third electrode 330 in the first region R1 may be easily prevented, and the transmittance of the organic light emitting display apparatus 300 may be improved.

FIGS. 25 to 28 illustrate a method of manufacturing the organic light emitting display apparatus illustrated in FIG. 23 in sequence.

Figure 25:
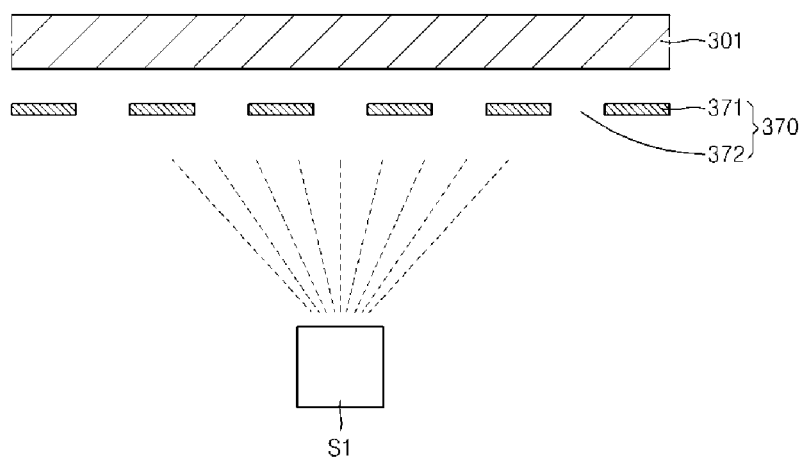
FIGS. 25, 26, 27, and 28 illustrate a method of manufacturing the organic light emitting display apparatus in FIG. 23 in sequence.

Referring to FIG. 25, a deposition process is conducted with respect to the substrate 301. Even though not illustrated, the elements up to second electrode 322 are formed on the substrate 301.

A mask 370 is disposed so as to face the substrate 301, and the deposition process is conducted by using a first deposition source S1. The mask includes a shielding part 371 and a slit part 372. The slit part 372 has a specific pattern corresponding to a region for forming the capping layer 340, that is, the first region R1.

Through conducting the deposition process by using the first deposition source S1, the first capping layer 341 of the capping layer 340 is formed on the second electrode 322 in the first region R1.

Figure 26:
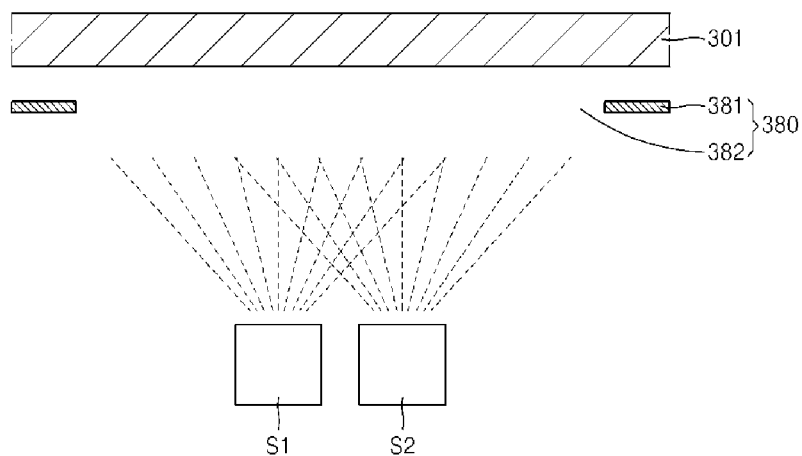

Referring to FIG. 26, the deposition process is conducted with respect to the substrate 301 including the elements formed up to the first capping layer 341. That is, an open mask 380 is disposed so as to face the substrate 301, and a co-deposition process using the first deposition source S1 and the second deposition source S2 is conducted. Alternatively the use of the open mask 380 may be omitted.

Through conducting the co-deposition process by using the first deposition source S1 and the second deposition source S2, the lower electrode layer 331 is formed on the second electrode 322 in the second region R2, and the second capping layer 342 is formed on the first capping layer 341 in the first region R1.

In this case, the material for forming the lower electrode layer 331 of the third electrode 330 included in the second deposition source S2 has poor adhesiveness with the first capping layer 341. Thus, a layer of deposition source S2 material may not be formed on the first capping layer 341, but a layer of deposition source S2 material may be formed on the second electrode 322 having relatively good adhesiveness. Similarly, the material for forming the second capping layer 342 included in the first deposition source S1 may be formed on the first capping layer 341 having relatively good adhesiveness.

Figure 27:
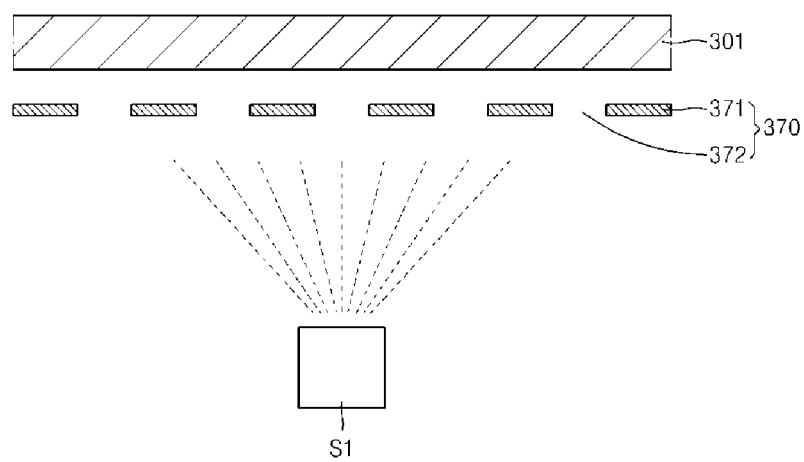

Then, referring to FIG. 27, the deposition process is conducted with respect to the substrate 301 including the elements formed up to the lower electrode layer 331 and the second capping layer 342.

After disposing the mask 370 so as to face the substrate 301, the deposition process is conducted by using the first deposition source S1. The deposition process through the first deposition source S1 is conducted to form the third capping layer 343 on the second capping layer 342 in the first region R1.

Figure 28:
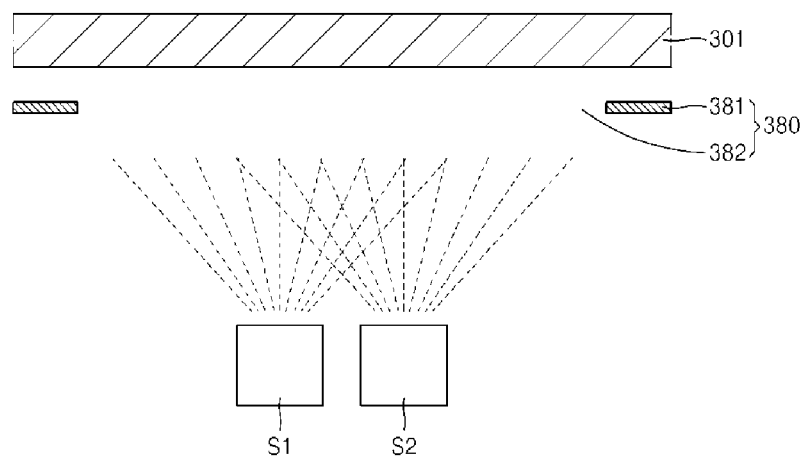

Then, referring to FIG. 28, the deposition process is conducted with respect to the substrate 301 including the elements formed up to the third capping layer 343. That is, the open mask 380 is disposed so as to face the substrate 301, and the co-deposition process using the first deposition source S1 and the second deposition source S2 is conducted. Alternatively, the use of the open mask 380 may be omitted.

Through conducting the co-deposition process using the first deposition source S1 and the second deposition source S2, the upper electrode layer 332 is formed on the lower electrode layer 331 in the second region R2, and the fourth capping layer 344 is formed on the third capping layer 343 in the first region R1.

In this case, the material for forming the upper electrode layer 332 of the third electrode 330 included in the second deposition source S2 has poor adhesiveness with the third capping layer 343. Thus, a layer of the second deposition source S2 material may not be formed on the third capping layer 343, but a layer of the second source S2 material may be formed on the lower electrode layer 331 having relatively good adhesiveness. Similarly, the material for forming the fourth capping layer 344 included in the first deposition source S1 may form a layer on the third capping layer 343 having relatively good adhesiveness In this example embodiment, after forming the first capping layer 341 using the mask 370, the second capping layer 342 and the lower electrode layer 331 are formed using the open mask 380 at the same time. In addition, after forming the third capping layer 343 using the mask 370, the fourth capping layer 344 and the upper electrode layer 332 are formed using the open mask 380 at the same time.

Through conducting the above-described processes, the capping layer 340 having a pattern with a target thickness may be easily formed. Particularly, the minute pattern of the capping layer 340 may be controlled so as to correspond to only the first region R1 may be possible.

In addition, while depositing the second capping layer 342 and the fourth capping layer 344 using the open mask 380, the lower electrode layer 331 and the upper electrode layer 332 of the third electrode 330 may be formed at the same time. Thus, the minute patterning of the third electrode 330 in the second region R2 without using a specific pattern mask may be easily conducted.

FIGS. 29 to 32 illustrate another method of manufacturing the organic light emitting display apparatus illustrated in FIG. 23 in sequence.

Figure 29:
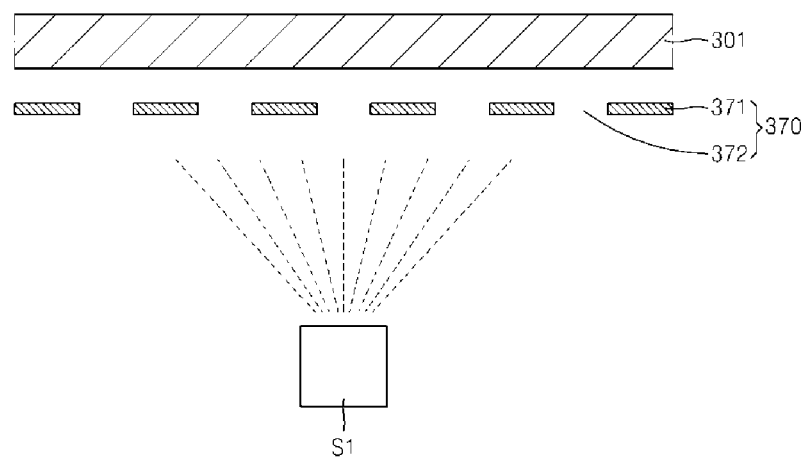
FIGS. 29, 30, 31, and 32 illustrate another method of manufacturing the organic light emitting display apparatus in FIG. 23 in sequence.

First, referring to FIG. 29, a deposition process is conducted with respect to the substrate 301. Even though not illustrated, the elements up to second electrode 322 are formed on the substrate 301.

A mask 370 is disposed so as to face the substrate 301, and the deposition process is conducted using the first deposition source S1. The mask 370 includes the shielding part 371 and the slit part 372. The slit part 372 has a specific pattern corresponding to a region for forming the capping layer 340, that is, the first region R1.

Through conducting the deposition process by using the first deposition source S1, the first capping layer 341 of the capping layer 340 is formed on the second electrode 322 in the first region R1.

Figure 30:
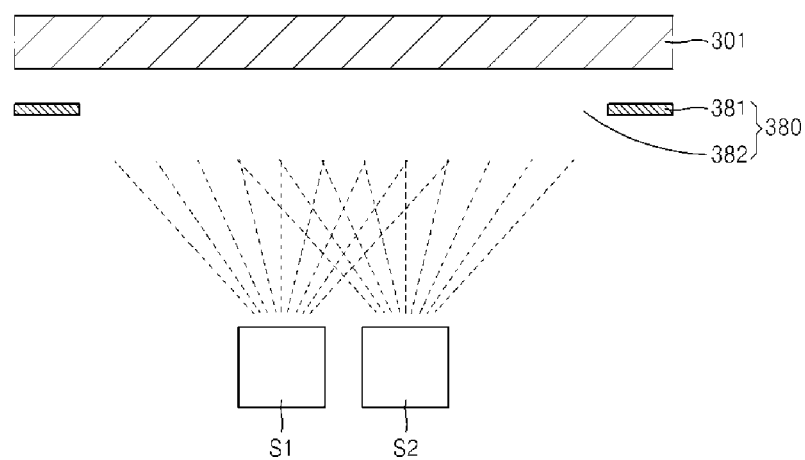

Referring to FIG. 30, the deposition process is conducted with respect to the substrate 301 including the elements formed up to the first capping layer 341. That is, the open mask 380 is disposed so as to face the substrate 301, and the co-deposition process is conducted using the first deposition source S1 and the second deposition source S2. Alternatively, the use of the open mask 380 may be omitted.

Through conducting the co-deposition process using the first deposition source S1 and the second deposition source S2, the lower electrode layer 331 is formed on the second electrode 322 in the second region R2, and the second capping layer 342 is formed on the first capping layer 341 in the first region R1.

In this case, the material for forming the lower electrode layer 331 of the third electrode 330 included in the second deposition source S2 has poor adhesiveness with the first capping layer 341. Thus, a layer of the second deposition source S2 material may not be formed on the first capping layer 341, but a layer of the second deposition source S2 material may be formed on the second electrode 322 having relatively good adhesiveness. Similarly, the material for forming the second capping layer 342 included in the first deposition source S1 may form a layer on the first capping layer 341 having relatively good adhesiveness.

Figure 31:
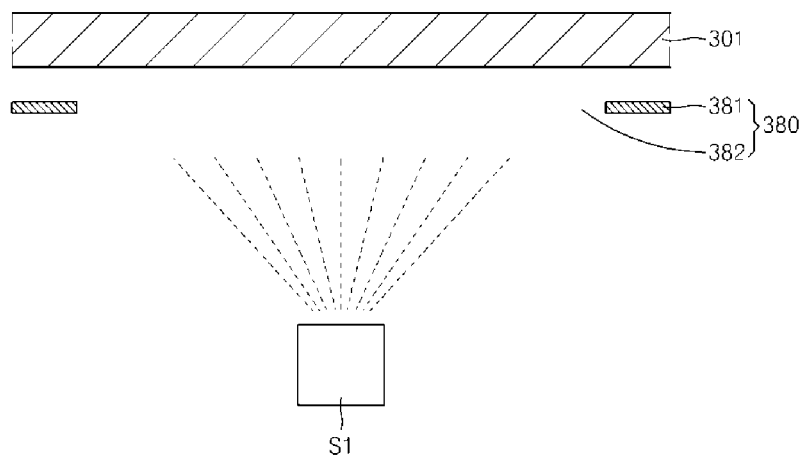

Then, referring to FIG. 31, the deposition process is conducted with respect to the substrate 301 including the elements formed up to the lower electrode layer 331 and the second capping layer 342.

After disposing the mask 380 so as to face the substrate 301, the deposition process is conducted by using the first deposition source S1. Through conducting the deposition process by using the first deposition source S1, the third capping layer 343 is formed on the second capping layer 342 in the first region R1. In this case, the material for forming the third capping layer included in the first deposition source S1 has good adhesiveness with the second capping layer 342 but has poor adhesiveness with the lower electrode layer 331. Thus, a layer of the first deposition source S1 material may not be formed on the lower electrode layer 331, but a layer of the first deposition source S1 material may be formed on the second capping layer 342 having relatively good adhesiveness.

Figure 32:
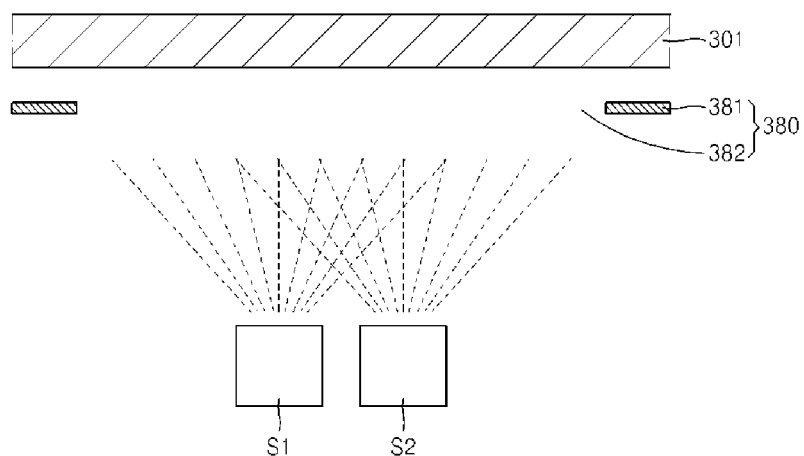

Referring to FIG. 32, the deposition process is conducted with respect to the substrate 301 including the elements formed up to the third capping layer 343. That is, the open mask 380 is disposed so as to face the substrate 301, and the co-deposition process using the first deposition source S1 and the second deposition source S2 is conducted. Alternatively, the use of the open mask 380 may be omitted.

Through conducting the co-deposition process by using the first deposition source S1 and the second deposition source S2, the upper electrode layer 332 is formed on the lower electrode layer 331 in the second region R2, and the fourth capping layer 344 is formed on the third capping layer 343 in the first region R1.

In this case, the material for forming the upper electrode layer 332 of the third electrode 330 included in the second deposition source S2 has poor adhesiveness with the third capping layer. Thus, a layer of the second deposition source S2 material may not be formed on the third capping layer 343, but a layer of the second deposition source S2 material may be formed on the lower electrode layer 331 having relatively good adhesiveness. Similarly, the material for forming the fourth capping layer 344 included in the first deposition source S1 may form a layer on the third capping layer 343 having relatively good adhesiveness.

In this example embodiment, after forming the first capping layer 341 using the mask 370, the second capping layer 342 and the lower electrode layer 331 are formed using the open mask 380 at the same time. Then, after forming the third capping layer 343 using the open mask 380, the fourth capping layer 344 and the upper electrode layer 332 are formed using the open mask 380 at the same time.

Through conducting the above-described processes, the capping layer 340 having a target pattern to a target thickness may be easily formed. Particularly, the minute pattern of the capping layer 340 may be controlled so as to correspond only to the first region R1 may be possible.

In addition, while depositing the second capping layer 342 and the fourth capping layer 344 using the open mask 380, the lower electrode layer 331 and the upper electrode layer 332 of the third electrode 330 may be formed at the same time. Thus, the minute patterning of the third electrode 330 in the second region R2 without using a mask having a specific pattern may be easily accomplished.

Figure 33:
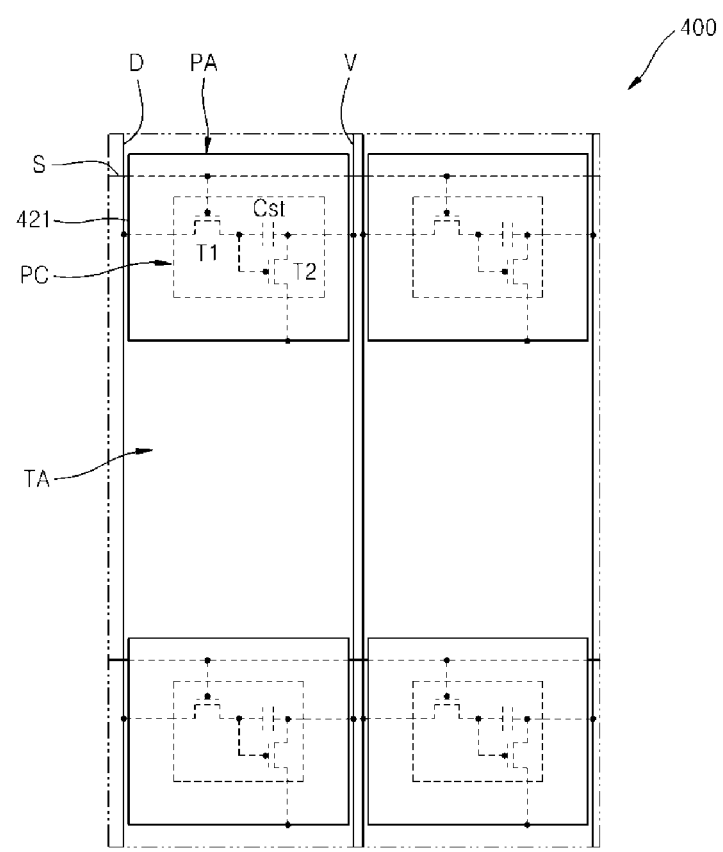
FIG. 33 is a plan view illustrating an organic light emitting display apparatus according to another example embodiment.
Figure 34:
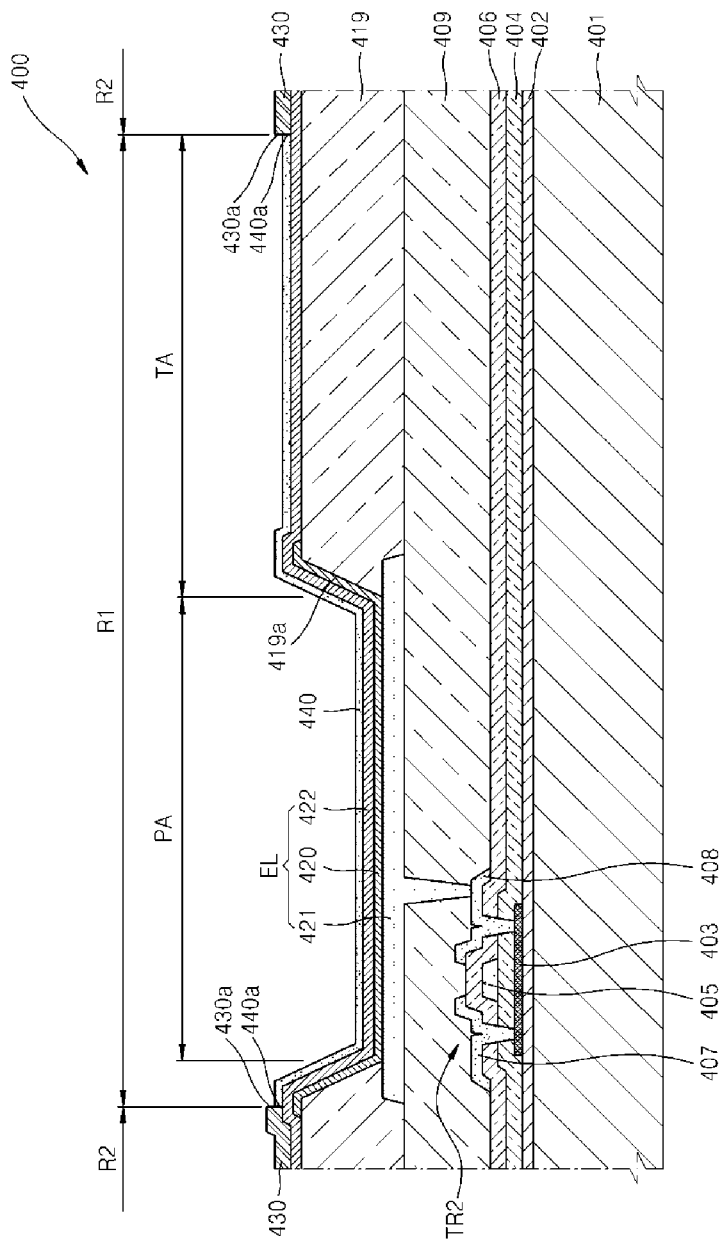
FIG. 34 is a cross-sectional view illustrating one pixel of the organic light emitting display apparatus in FIG. 33.

FIG. 33 is a plan view illustrating an organic light emitting display apparatus according to another example embodiment, and FIG. 34 is a cross-sectional view illustrating one pixel of the organic light emitting display apparatus in FIG. 33.

The organic light emitting display apparatus 400 includes a light-transmitting area TA formed to transmit an external light, and a plurality of pixel areas PA separated from each on either side of the light-transmitting area TA.

As illustrated in FIG. 33, a pixel circuit part PC is positioned in each of the pixel areas PA, and a plurality of conductive lines such as a scan line S, a data line D and a power source line V are electrically connected to the pixel circuit part PC. Even though not illustrated, various conductive lines apart from the scan line S, the data line D and the power source line V may be provided according to the constitution of the pixel circuit part PC.

In addition, the pixel circuit part PC includes a first thin film transistor T1 connected to the scan line S and the data line D, a second thin film transistor T2 connected to the first thin film transistor T1 and the power source line V, and a capacitor Cst connected to the first thin film transistor T1 and the second thin film transistor T2. In this case, the first thin film transistor T1 may be a switching transistor, and the second thin film transistor T2 may be a driving transistor. The second thin film transistor T2 is electrically connected to the first electrode 421. The number of the above-described thin film transistors and the capacitor is not limited to that of the illustrated example embodiment, and two or more thin film transistors and one or more capacitors may be combined according to the pixel circuit part PC.

Referring to FIG. 33, the scan line S and the first electrode 421 are disposed overlapping each other. However, example embodiments are not limited thereto. At least one of the plurality of the conductive lines including the scan line S, the data line D and the power source line V may be disposed overlapping the first electrode 421. Alternatively, all of the plurality of the conductive lines including the scan line S, the data line D and the power source line V may be disposed overlapping the first electrode 421, or may be disposed adjacent to the first electrode 421 according to the design requirements.

In this example embodiment, distortion due to the scattering of the external light due to the patterns of the devices in the pixel circuit part PC may be prevented.

The pixel area PA and the light-transmitting area TA are formed so that the ratio of the area of the light-transmitting area TA to the total area of the pixel area PA and the light-transmitting area TA is in the range of from about 5% to about 90%.

When the ratio of the area of the light-transmitting area TA to the total area of the pixel area PA and the light-transmitting area TA is less than about 5%, it may be difficult for a user to observe an object or an image positioned at the opposite side of the organic light emitting display apparatus 400. That is, the transparency of the organic light emitting display apparatus 400 is poor. However, when the intensity of an external light is high, even if the ratio of the area of the light-transmitting area TA to the total area of the pixel area PA and the light-transmitting area TA is about 5%, a user may be able to visually recognize an object or an image positioned at the opposite side of the organic light emitting display apparatus 400. Thus, the user may recognize the organic light emitting display apparatus 400 as a light-transmitting display apparatus.

When the ratio of the area of the light-transmitting area TA to the total area of the pixel area PA and the light-transmitting area TA exceeds about 90%, it may be difficult to generate a stable image through the light emitting in the pixel area PA. That is, as the area of the pixel area PA decreases, the luminance of the light emitted from the intermediate layer 420 is to be increased to generate a stable image. When the luminance of the light emitted from the organic light emitting device is increased as described above, the lifetime of the organic light emitting device may be rapidly decreased.

The ratio of the area of the light-transmitting area TA to the total area of the pixel area PA and the light-transmitting area TA may be in the range of from about 20% to about 70%.

When the ratio of the area of the light-transmitting area TA to the total area of the pixel area PA and the light-transmitting area TA is less than about 20%, the area of the pixel area PA is excessively large when compared with the light-transmitting area TA. Thus, a user may perceive the limit in observing the image at the opposite position through the light-transmitting area TA. When the ratio exceeds about 70%, the design of the pixel circuit part PC to be disposed in the pixel area PA may be limited.

In the pixel area PA, the first electrode 421, which is electrically connected to the pixel circuit part PC, may be provided. The pixel circuit part PC may be overlapped by the first electrode 421 so as to be shielded by the first electrode 421. In addition, at least one of the conductive lines including the above-described scan line S, the data line D and the power source line V may be disposed so as to cross the first electrode 421. Alternatively, because these conductive lines have a smaller inhibition ratio on the transmittance when compared with the pixel circuit part PC, all of the conductive lines may be disposed adjacent to the first electrode 421 according to design constraints.

As described above, when the first electrode 421 includes a reflection layer manufactured by using a conductive metal for reflecting light, the first electrode 421 may shield the pixel circuit part PC, and the distortion of the external image due to the pixel circuit part PC in the pixel area PA may be prevented.

As illustrated in FIG. 34, the pixel area PA and the light-transmitting area TA are positioned in the first region R1.

In this case, because the capping layer 440 is positioned in the first region R1, all of the pixel area PA and the light-transmitting area TA may be covered. In addition, the third electrode 430 is provided in the second region R2 which is at the outer region of the first region R1.

In this example embodiment, because the capping layer 440 uses light-transmitting organic materials as described above, the light transmittance in the light-transmitting area TA may not be affected. The structure, the material, the manufacturing method, etc. of the capping layer 440 and the third electrode 430 are the same as those described in the above-described embodiments.

Even though not illustrated in the drawings, the light transmittance in the light-transmitting area TA may be increased by forming a light-transmitting window by excluding at least a portion of the second electrode 430 in the light-transmitting area TA. In this case, the light-transmitting window may be further formed on at least one layer among the pixel defining layer 419, the passivation layer 409, the interlayer insulating layer 406, the gate insulating layer 404 and the buffer layer 402, let alone the second electrode 430 by removing a portion of the second electrode 430.

Figure 35:
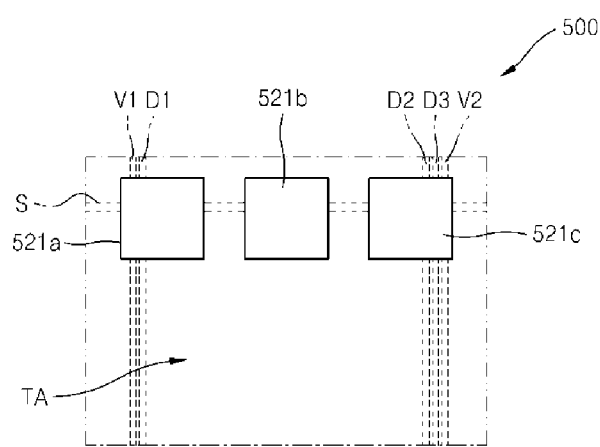
FIG. 35 is a plan view illustrating an organic light emitting display apparatus according to another example embodiment.

FIG. 35 is a plan view illustrating an organic light emitting display apparatus according to another example embodiment. Particularly, FIG. 35 illustrates three plan views corresponding to three sub-pixels of an organic light emitting display apparatus 500.

Referring to FIG. 35, one light-transmitting area TA corresponding to first electrodes 521a, 521b and 521c of the three sub-pixels is formed. The first data line D1 to third data line D3 are electrically connected with the first electrodes 521a, 521b and 5421c of the three sub-pixels, respectively. In addition, a first power source line V1 makes an electric connection with the first electrode 521a and the second first electrode 521b, and a second power source line V2 makes an electric connection with the third first electrode 521c.

In this structure, one large light-transmitting area TA may be provided with respect to a plurality of the sub-pixels. Thus, the transmittance of the total display may be increased even higher, and the image distortion due to the scattering of light may be decreased still more.

Even though not illustrated, a light-transmitting window may be further formed on at least one layer of a second electrode, a pixel defining layer, a passivation layer, an insulating interlayer, a gate insulating layer and a buffer layer in the light-transmitting area TA.

In addition, in this example embodiment, the light-transmitting area TA and the pixel area PA are disposed in the first region (not illustrated), and a capping layer (not illustrated) is disposed in the first region (not illustrated) to cover the light-transmitting area TA and the pixel area PA. In addition, a third electrode (not illustrated) may be formed in the second region which is the outer region of the first region (not illustrated).

While the present disclosure has been particularly shown and described with reference to exemplary embodiments thereof, it will be understood by those of ordinary skill in the art that various changes in form and details may be made therein without departing from the spirit and scope of the present disclosure, including the following claims.

What is claimed is:

1. An organic light emitting display apparatus comprising:
   a substrate;
   a first electrode formed on the substrate;
   an intermediate layer formed on the first electrode, the intermediate layer including an organic emission layer;
   a second electrode formed on the intermediate layer;
   a capping layer formed on the second electrode in a first region, the capping layer including a first edge portion and at least two layers; and
   a third electrode on the second electrode in a second region, the second region being not overlapped with the first region, the third electrode including a second edge portion having a side portion facing a side portion of the first edge portion of the capping layer, wherein the third electrode comprises a lower electrode layer and an upper electrode layer, wherein the lower electrode layer is on the second electrode.

2. The organic light emitting display apparatus of claim 1, wherein
   the third electrode includes a lower electrode layer and an upper electrode layer stacked in sequence, and
   the capping layer includes a first capping layer and a second capping layer stacked in sequence.

3. The organic light emitting display apparatus of claim 1, wherein
   the capping layer includes a first capping layer and a second capping layer stacked in sequence.

4. The organic light emitting display apparatus of claim 1, wherein
   the third electrode includes a lower electrode layer and an upper electrode layer stacked in sequence, and
   the capping layer includes a first capping layer, a second capping layer, a third capping layer and a fourth capping layer stacked in sequence.

5. The organic light emitting display apparatus of claim 1, wherein a thickness of the third electrode is greater than a thickness of the second electrode.

6. The organic light emitting display apparatus of claim 1, wherein adhesiveness between the third electrode and the capping layer is smaller than adhesiveness between the third electrode and the second electrode.

7. The organic light emitting display apparatus of claim 1, wherein the capping layer comprises 8-quinolinolato lithium, N,N-diphenyl-N,N-bis(9-phenyl-9H-carbazol-3-yl)biphenyl-4,4'-diamine), N(diphenyl-4-yl)9,9-dimethyl-N-(4(9-phenyl-9H-carbazol-3-yl)phenyl)-9H-fluorene-2-amine), or 2-(4-(9,10-di(naphthalene-2-yl)anthracene-2-yl)phenyl)-1-phenyl-1H-benzo-[D]imidazole.

8. The organic light emitting display apparatus of claim 1, wherein the third electrode comprises Mg.

9. The organic light emitting display apparatus of claim 1, comprising a light-transmitting area for transmitting an external light and a pixel area adjacent to the light-transmitting area and emitting light, the light-transmitting area and the pixel area being positioned in the first region, and the first electrode being overlapped with the pixel area.

10. The organic light emitting display apparatus of claim 1,
    further comprising a thin film transistor including an active layer, a gate electrode, a source electrode and a drain electrode, the thin film transistor being electrically connected with the first electrode, and
    the first electrode being disposed so as to shield the thin film transistor.

11. The organic light emitting display apparatus of claim 1, wherein the capping layer is light-transmitting.

12. The organic light emitting display apparatus of claim 1, wherein all of edge portions of the capping layer and an edge portion of the third electrode are in contact with one another.

13. The organic light emitting display apparatus of claim 1, wherein an area of the capping layer is greater than a light emitting area of one pixel.

* * * * *